United States Patent
Hwang et al.

(10) Patent No.: US 10,026,747 B2
(45) Date of Patent: Jul. 17, 2018

(54) NON-VOLATILE MEMORY DEVICE WITH FIRST GATE STRUCTURE IN MEMORY CELL REGION AND SECOND GATE STRUCTURE IN PERIPHERAL CIRCUIT REGION AND NON-VOLATILE MEMORY SYSTEM INCLUDING THE SAME

(71) Applicant: SAMSUNG ELECTRONICS CO., LTD., Suwon-si, Gyeonggi-Do (KR)

(72) Inventors: Chul-Jin Hwang, Seongnam-si (KR); Pan-Suk Kwak, Seoul (KR); Seok-Jun Ham, Seoul (KR)

(73) Assignee: SAMSUNG ELECTRONICS CO., LTD., Suwon-si, Gyeonggi-Go (KR)

( * ) Notice: Subject to any disclaimer, the term of this patent is extended or adjusted under 35 U.S.C. 154(b) by 0 days.

(21) Appl. No.: 15/239,121

(22) Filed: Aug. 17, 2016

(65) Prior Publication Data
US 2017/0053923 A1    Feb. 23, 2017

(30) Foreign Application Priority Data
Aug. 19, 2015    (KR) .................. 10-2015-0116853

(51) Int. Cl.
| | | |
|---|---|---|
| G11C 29/24 | (2006.01) | |
| G11C 29/02 | (2006.01) | |
| H01L 27/11582 | (2017.01) | |
| G11C 16/04 | (2006.01) | |
| G11C 5/02 | (2006.01) | |
| H01L 49/02 | (2006.01) | |

(52) U.S. Cl.
CPC .......... *H01L 27/11582* (2013.01); *G11C 5/02* (2013.01); *G11C 5/025* (2013.01); *G11C 16/0483* (2013.01); *G11C 29/24* (2013.01); *H01L 28/00* (2013.01); *G11C 29/021* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 7,889,538 B2 | 2/2011 | Toda | |
| 8,338,882 B2 | 12/2012 | Tanaka et al. | |
| 8,488,399 B2 | 7/2013 | Yu et al. | |
| 8,553,445 B2 | 10/2013 | Baek et al. | |
| 8,593,869 B2 | 11/2013 | Tanzawa | |

(Continued)

*Primary Examiner* — J. H. Hur
(74) *Attorney, Agent, or Firm* — F. Chau & Associates, LLC

(57) ABSTRACT

A non-volatile memory device is provided as follows. A substrate has a peripheral circuit. A first semiconductor layer is disposed on the substrate. The first semiconductor layer includes a memory cell region. A first gate structure is disposed on the first semiconductor layer. The first gate structure includes a plurality of first gate electrodes stacked in a perpendicular direction to the first semiconductor layer and a plurality of vertical channel structures penetrating the plurality of first gate electrodes. The first gate structure is arranged in the memory cell region. A second gate structure is disposed on the substrate. The second gate structure includes a plurality of second gate electrodes stacked in the perpendicular direction to the first semiconductor layer. The second gate structure is arranged outside the memory cell region.

21 Claims, 36 Drawing Sheets

(56) References Cited

U.S. PATENT DOCUMENTS

| | | |
|---|---|---|
| 8,634,242 B2 | 1/2014 | Grossi et al. |
| 8,717,804 B2 | 5/2014 | Toda |
| 9,019,739 B2 | 4/2015 | Park et al. |
| 2004/0027856 A1* | 2/2004 | Lee .................... G11C 16/0408 365/185.11 |
| 2010/0163830 A1 | 7/2010 | Chang et al. |
| 2011/0121403 A1* | 5/2011 | Lee ................... H01L 27/11526 257/390 |
| 2011/0220987 A1* | 9/2011 | Tanaka .............. H01L 27/11575 257/324 |
| 2013/0049094 A1 | 2/2013 | Kwon |
| 2013/0127011 A1* | 5/2013 | Higashitani ....... H01L 27/11575 257/532 |
| 2014/0003149 A1* | 1/2014 | Maejima ................ G11C 5/063 365/185.17 |
| 2014/0085979 A1 | 3/2014 | Kono |
| 2015/0008506 A1 | 1/2015 | Yang et al. |
| 2015/0263024 A1* | 9/2015 | Hishida ........... H01L 21/823437 257/329 |

* cited by examiner

NON-VOLATILE MEMORY DEVICE WITH FIRST GATE STRUCTURE IN MEMORY CELL REGION AND SECOND GATE STRUCTURE IN PERIPHERAL CIRCUIT REGION AND NON-VOLATILE MEMORY SYSTEM INCLUDING THE SAME

CROSS-REFERENCE TO RELATED APPLICATION

This application claims priority under 35 U.S.C. § 119 to Korean Patent Application No. 10-2015-0116853, filed on Aug. 19, 2015 in the Korean Intellectual Property Office, the disclosure of which is incorporated by reference herein in its entirety.

TECHNICAL FIELD

The present inventive concept relates to a non-volatile memory device and a non-volatile memory system.

DISCUSSION OF RELATED ART

As information communication devices become multi-functional, a larger-capacity and more highly integrated memory device is produced. For the highly integrated memory device, a memory cell size continues to be reduced, but the memory device may include ever-increasing operation circuits and/or wiring structures. Those operation circuits and/or wiring structures may prevent the memory device from being reduced in size.

SUMMARY

According to an exemplary embodiment of the present inventive concept, a non-volatile memory device is provided as follows. A substrate has a peripheral circuit. A first semiconductor layer is disposed on the substrate. The first semiconductor layer includes a memory cell region. A first gate structure is disposed on the first semiconductor layer. The first gate structure includes a plurality of first gate electrodes stacked in a perpendicular direction to the first semiconductor layer and a plurality of vertical channel structures penetrating the plurality of first gate electrodes. The first gate structure is arranged in the memory cell region. A second gate structure is disposed on the substrate. The second gate structure includes a plurality of second gate electrodes stacked in the perpendicular direction to the first semiconductor layer. The second gate structure is arranged outside the memory cell region.

According to an exemplary embodiment of the present inventive concept, a non-volatile memory device is provided as follows. A substrate includes a peripheral circuit. A memory cell array is disposed on the substrate and overlapped with a first portion of the peripheral circuit in a perpendicular direction to the substrate. The memory cell array includes a first gate structure. A second gate structure is disposed on the substrate. The second gate structure is electrically isolated from the memory cell array and overlaps a second portion of the peripheral circuit in the perpendicular direction to the substrate. According to an exemplary embodiment, a non-volatile memory system includes a non-volatile memory device and a memory controller.

The non-volatile memory device is provided as follows. A substrate includes a peripheral circuit. A memory cell array is disposed on the substrate and overlapped with a first portion of the peripheral circuit in a perpendicular direction to the substrate. The memory cell array includes a first gate structure. A second gate structure is disposed on the substrate. The second gate structure is electrically isolated from the memory cell array and overlaps a second portion of the peripheral circuit in the perpendicular direction to the substrate. The memory controller generates a control signal for controlling operations of the memory cell array based on data obtained from the second gate structure and provides the control signal to the non-volatile memory device.

According to an exemplary embodiment, a non-volatile memory system includes a non-volatile memory device and a memory controller. The non-volatile memory device includes a memory cell array, a test cell array and a control logic. The memory cell array and the test cell array are disposed on the control logic. The memory cell array and the test cell array are positioned higher than the control logic. A first portion of the control logic vertically overlaps the memory cell array and a second portion of the control logic vertically overlaps the test cell array. A memory controller is coupled to the non-volatile memory device so that the memory controller receives a test result of the test cell array from the non-volatile memory device and control an operation of the non-volatile memory device based on the test result.

BRIEF DESCRIPTION OF THE DRAWINGS

These and other features of the inventive concept will become more apparent by describing in detail exemplary embodiments thereof with reference to the accompanying drawings of which.

Figure 1A:
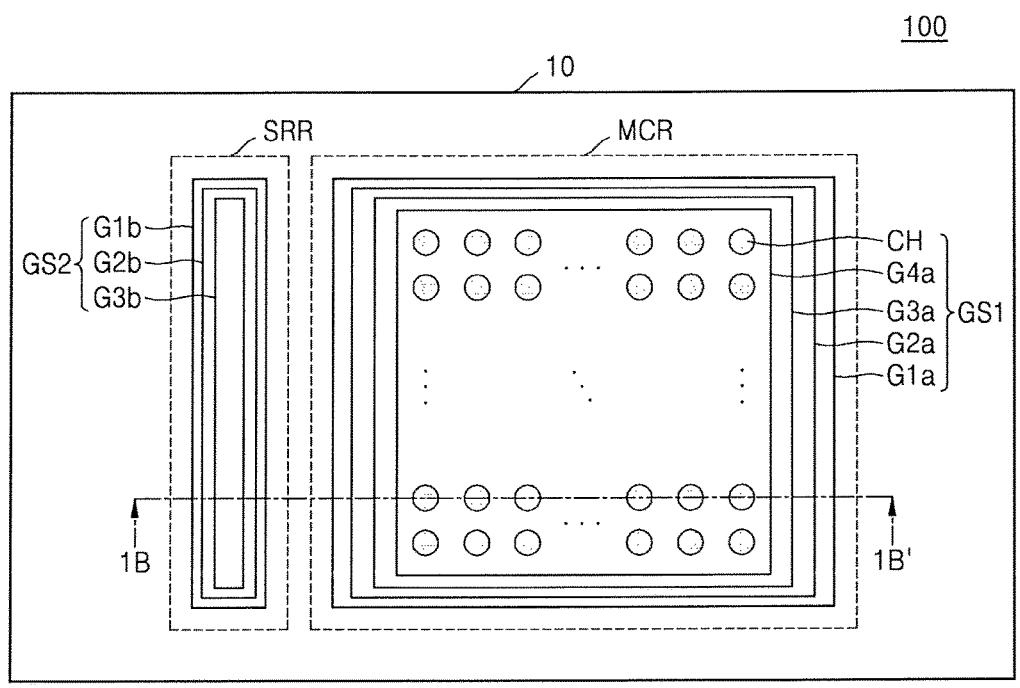
FIGS. 1A and 1B are schematic diagrams showing a main configuration of a memory device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Sizes and thicknesses of constituent members shown in the accompanying drawings are arbitrarily given for better understanding and ease of description. In the drawings, the thicknesses and/or areas of layers, films, regions, etc., are exaggerated for clarity.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 1B:
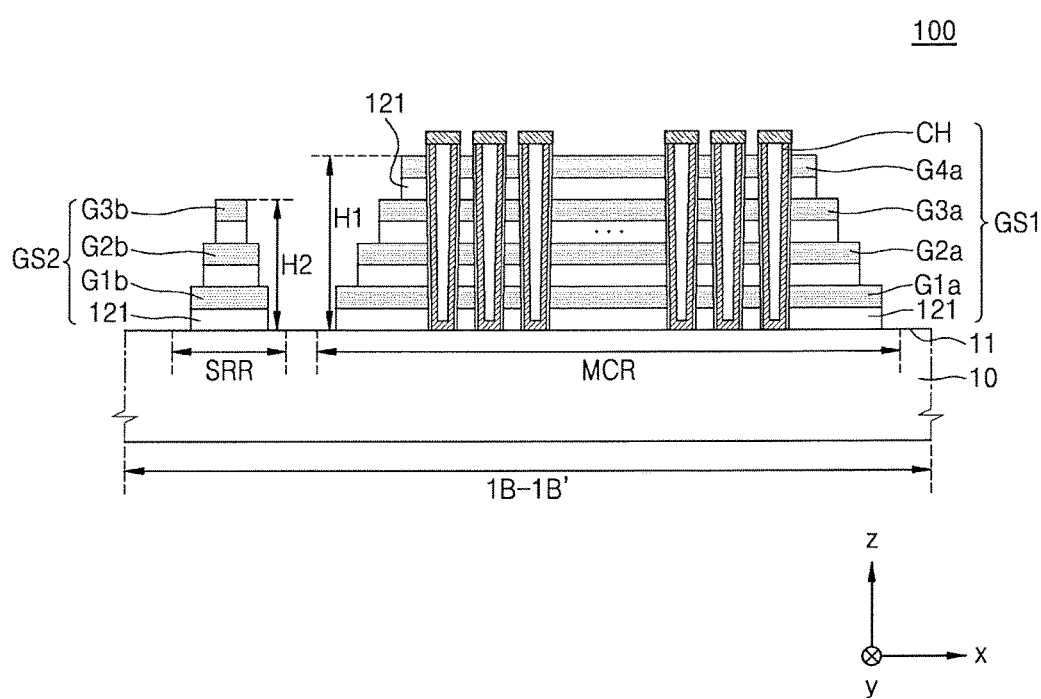

FIGS. 1A and 1B are schematic diagrams showing a main configuration of a memory device according to an exemplary embodiment of the present inventive concept. FIG. 1A is a layout diagram of the memory device, and FIG. 1B is a schematic sectional view of the memory device taken along line 1B-1B' of FIG. 1A.

Referring to FIGS. 1A and 1B, a memory device 100 may include a first semiconductor layer 10, a first gate structure GS1, and a second gate structure GS2.

The first semiconductor layer 10 may have a main surface 11 extending in a first direction (the x direction) and in a second direction (the y direction). In an exemplary embodiment, the first semiconductor layer 10 may include impurity-doped polysilicon. In an exemplary embodiment, the first semiconductor layer 10 may include Si, Ge, or SiGe. In an exemplary embodiment, the first semiconductor layer 10 may include a polysilicon substrate, a silicon-on-insulator (SOI) substrate, or a germanium-on-insulator (GeOI) substrate.

A memory cell region MCR and a peripheral region SRR may be formed on the main surface 11 of the first semiconductor layer 10. The memory cell region MCR is a region in which a memory cell array is formed. The peripheral region SRR is a region adjoining at least one side out of four sides of the memory cell region MCR, and may be formed parallel to the memory cell region MCR. In FIG. 1, one peripheral region SRR is illustrated for convenience. In an exemplary embodiment, the memory cell region MCR and the peripheral region SRR may be respectively defined as different well regions. In an exemplary embodiment, the memory cell region MCR and the peripheral region SRR may be regions which are located in one well region and electrically isolated from each other. The first gate structure GS1 forming a memory cell array may be formed in the memory cell region MCR, and the second gate structure GS2 may be formed in the peripheral region SRR.

The first gate structure GS1 may be formed in the memory cell region MCR, and may constitute the memory cell array.

The first gate structure GS1 may include a plurality of gate electrodes G1a, G2a, G3a, G4a and a plurality of vertical channel structures CH, which are arranged in the memory cell region MCR. The plurality of gate electrodes G1a, G2a, G3a, G4a may be referred to as word lines, string select lines, ground select lines, or the like. The plurality of gate electrodes G1a, G2a, G3a, G4a may be stacked in a perpendicular direction to the first semiconductor layer 10 (the z direction). As shown in FIG. 1B, a gate electrode insulating layer 121 may be arranged on a lower or upper side of each of the plurality of gate electrodes G1a, G2a, G3a, G4a. The plurality of gate electrodes G1a, G2a, G3a, G4a may have a smaller area with increasing distance from the main surface 11 of the first semiconductor layer 10. Thus, as shown in FIGS. 1A and 1B, an edge region of the first gate structure GS1 may have a step shape. A contact (not shown) may be formed in the edge region of the first gate structure GS1. In addition, the plurality of gate electrodes G1a, G2a, G3a, G4a may be connected to a wiring line through the contact, and thus be provided with an electrical signal from a peripheral circuit (not shown).

The plurality of vertical channel structures CH may penetrate through the plurality of gate electrodes G1a, G2a, G3a, G4a and thus be connected to the first semiconductor layer 10. Although not shown in FIGS. 1A and 1B, a word line cut extending in the first direction (the x direction) or in the second direction (the y direction) may be formed between the plurality of vertical channel structures CH. The plurality of gate electrodes G1a, G2a, G3a, G4a and the plurality of vertical channel structures CH may constitute a 3-dimensional memory cell array. In the 3-dimensional memory cell array, at least one physical level of memory cell arrays having a circuit formed on a semiconductor layer (or a substrate) may be monolithically formed. The term "monolithically" means that layers of each of levels are stacked directly on layers of a lower level. The 3-dimensional memory cell array will be described below in detail with reference to FIGS. 2 to 4.

In FIG. 1, for the convenience of description, the first gate structure GS1 includes the first to fourth gate electrodes G1a, G2a, G3a, G4a. The present inventive concept is not limited thereto. For example, the number of gate electrodes may vary with structures of cell strings included in the memory cell array.

The second gate structure GS2 may be formed outside the memory cell region MCR. In addition, as shown in FIG. 1, the second gate structure GS2 may be formed in the peripheral region SRR. In an exemplary embodiment, a portion of the first semiconductor layer 10 under the second gate structure GS2 may be removed and the first semiconductor layer 10 may not be arranged under the second gate structure GS2. The second gate structure GS2 may include a plurality of gate electrodes G1b, G2b, G3b arranged in the peripheral region SRR. The plurality of gate electrodes G1b, G2b, G3b may be stacked in a perpendicular direction to the first semiconductor layer 10 (in the z direction). The gate electrode insulating layer 121 may be located between the plurality of gate electrodes G1b, G2b, G3b. An edge region of the second gate structure GS2 may also have a step shape, and a contact may be formed in the edge region.

The gate electrode of the second gate structure GS2 and the gate electrode of the first gate structure GS1, which are located at the same height from the main surface of the first semiconductor layer 10, may be simultaneously formed using the same process. For example, the first gate electrode G1a of the first gate structure GS1 and the first gate electrode G1b of the second gate structure GS2 may be simultaneously formed using the same process. Thus, the gate electrodes located at the same height from the main surface of the first semiconductor layer 10 may have the same height and material as one another.

In FIG. 1, for the convenience of description, the second gate structure GS2 includes the first to third gate electrodes G1b, G2b, G3b. The present inventive concept is not limited thereto. For example, the number of gate electrodes included in the second gate structure GS2 may be equal to or less than the number of gate electrodes included in the first gate structure GS1. Thus, a height H2 of the second gate structure GS2 may be equal to or lower than a height H1 of the first gate structure GS1.

The second gate structure GS2 may further include a plurality of vertical channel structures (not shown) penetrating through the plurality of gate electrodes G1b, G2b, G3b, although the plurality of vertical channel structures is not shown in FIGS. 1A and 1B.

The second gate structure GS2 may constitute a circuit element. In an exemplary embodiment, the second gate structure GS2 may be a circuit element used for operations of the memory cell array. For example, the second gate structure GS2 may include a passive element such as a capacitor or a resistor. In an exemplary embodiment, the second gate structure GS2 may include an active element such as a transistor. In an exemplary embodiment, the second gate structure GS2 may include a cell array. For example, the second gate structure GS2 may be used as a test element for testing electrical properties of the first gate structure GS1, that is, the memory cell array.

In the memory device 100 according to an exemplary embodiment of the inventive concept, the gate structure including the plurality of gate electrodes may be formed in the memory cell region MCR and outside the memory cell region MCR, and the gate structure located in the memory cell region MCR may be used as a circuit element. Thus, a layout area of the memory device may be reduced, and a size of a semiconductor chip on which the memory device is formed may be reduced.

Hereinafter, a memory cell array including the first gate structure of FIG. 1 and a plurality of memory blocks included in the memory cell array will be described in detail with reference to FIGS. 2 to 4.

Figure 2:
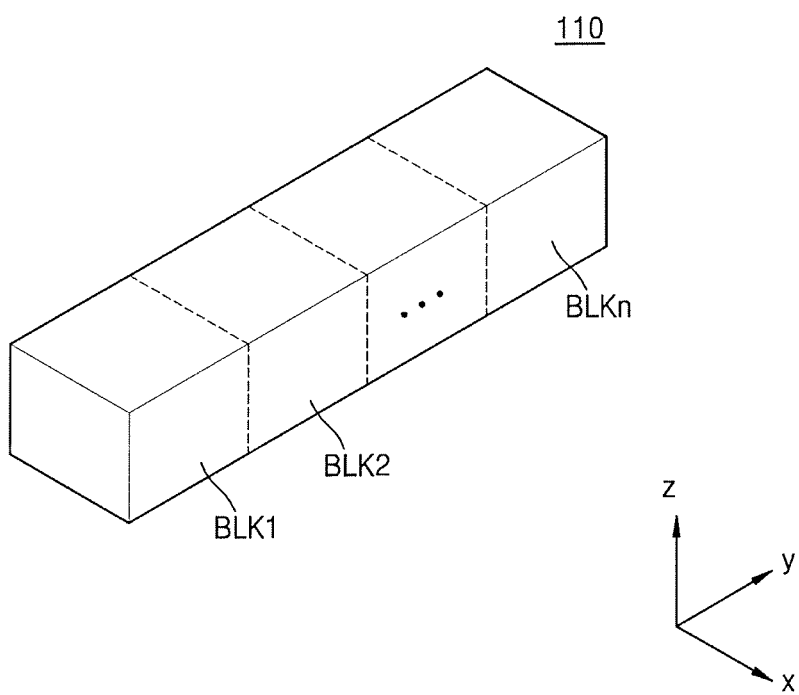
FIG. 2 is a block diagram showing a memory cell array according to an exemplary embodiment of the present inventive concept.

FIG. 2 is a block diagram showing a memory cell array according to an exemplary embodiment of the inventive concept.

Referring to FIG. 2, a memory cell array 110 includes a plurality of memory blocks BLK1 to BLKn. Each memory block BLK has a 3-dimensional structure (or a vertical structure). In an exemplary embodiment, each memory block BLK includes structures extending along a plurality of directions (x, y, and z directions) corresponding to a 3-dimension. For example, each memory block BLK may include a plurality of NAND cell strings extending along the z direction. For example, each memory block BLK may include the NAND cell strings vertically arranged such that one memory cell is located on another memory cell. Here, at least one of memory cells may include a charge trap layer.

Each of the NAND cell strings is connected to a bit line BL, a string select line SSL, a ground select line GSL, a word line WL, and a common source line CSL. That is, each memory block may be connected to a plurality of bit lines BL, a plurality of string select lines SSL, a plurality of ground select lines GSL, a plurality of word lines WL, and a plurality of common source lines CSL. The memory blocks BLK1 to BLKn will be described in more detail with reference to FIGS. 3A to 3C.

Figure 3A:
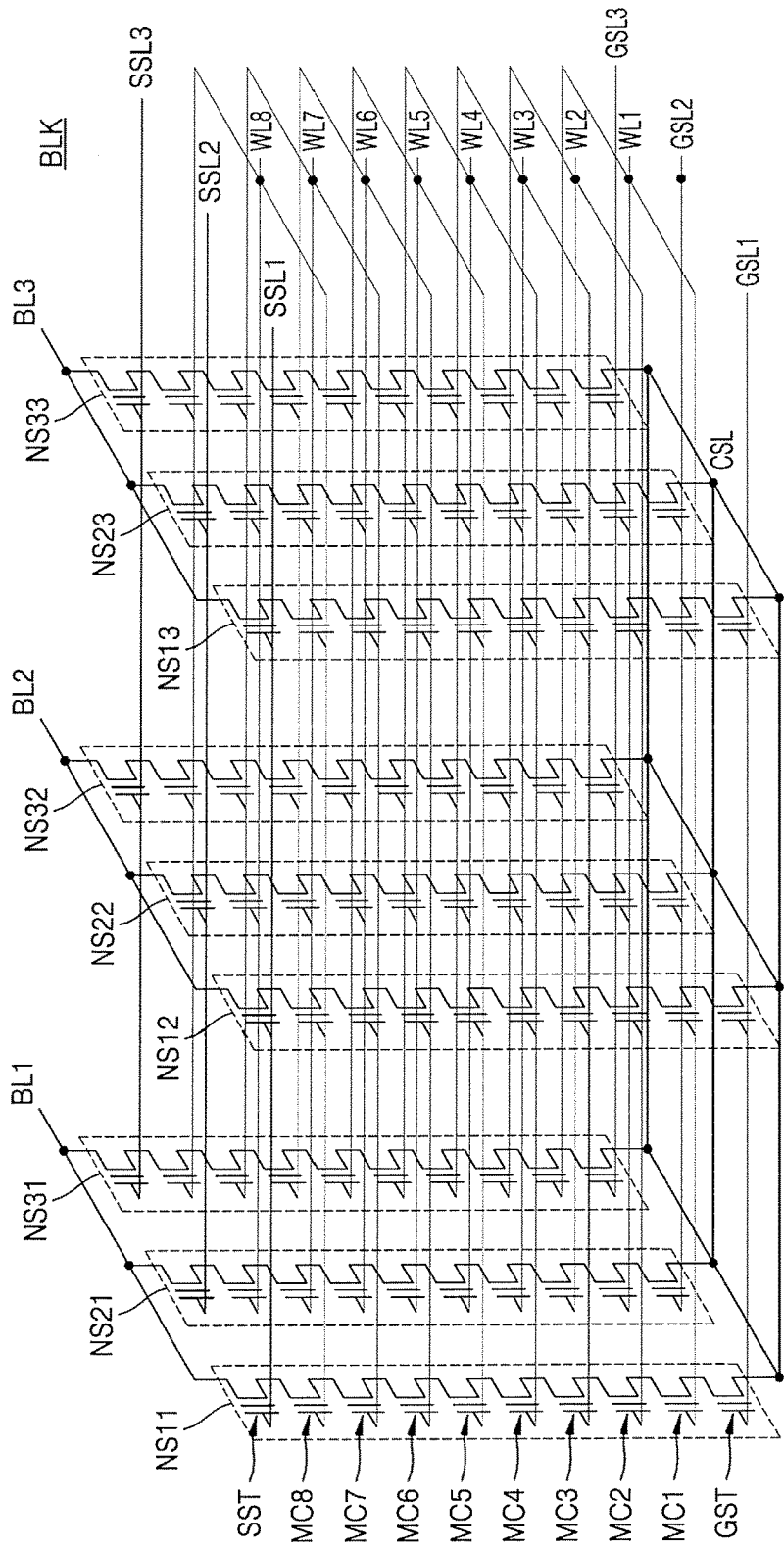
FIGS. 3A to 3C are circuit diagrams showing examples of a memory block of FIG. 2.

FIG. 3A is a circuit diagram showing an example of the memory block of FIG. 2.

Referring to FIG. 3A, the memory block BLK may be a NAND flash memory of a vertical structure, and each of the blocks BLK1 to BLKn shown in FIG. 2 may be realized as in FIG. 3A. The memory block BLK may include a plurality of NAND strings NS11 to NS33, a plurality of word lines WL1 to WL8, a plurality of bit lines BL1 to BL3, ground select lines GSL1, GSL2, GSL3, a plurality of string select lines SSL1 to SSL3, and a common source line CSL. Here, the number of NAND strings, the number of word lines, the number of bit lines, the number of ground select lines, and the number of string select lines may be variously changed according to embodiments.

The NAND strings NS11, NS21, NS31 are provided between the first bit line BL1 and the common source line CSL, the NAND strings NS12, NS22, NS32 are provided between the second bit line BL2 and the common source line CSL, and the NAND strings NS13, NS23, NS33 are provided between the third bit line BL3 and the common source line CSL. Each NAND string (for example, NS11) may include a string select transistor SST, a plurality of memory cells MC1 to MC8, and a ground select transistor GST, which are connected in series. Hereinafter, the NAND string will be referred to as a string for convenience.

The strings connected to one bit line in common may constitute one column. For example, the strings NS11, NS21, NS31 connected to the first bit line BL1 in common may correspond to a first column, the strings NS12, NS22, NS32 connected to the second bit line BL2 in common may correspond to a second column, and the strings NS13, NS23, NS33 connected to the third bit line BL3 in common may correspond to a third column.

The strings connected to one string select line constitute one row. For example, the strings NS11, NS12, NS13 connected to the first string select line SSL1 may correspond to a first row, the strings NS21, NS22, NS23 connected to the second string select line SSL2 may correspond to a second row, and the strings NS31, NS32, NS33 connected to the third string select line SSL3 may correspond to a third row.

The string select transistors SST are respectively connected to the string select lines SSL1 to SSL3. The plurality of memory cells MC1 to MC8 is respectively connected to corresponding word lines WL1 to WL8. The ground select transistors GST are respectively connected to the ground select lines GSL1, GSL2, GSL3. The string select transistor SST is connected to a corresponding bit line, and the ground select transistor GST is connected to the common source line CSL.

The word lines having the same height (for example, WL1) are connected to each other in common, and the string select lines SSL1 to SSL3 are separated from each other. For example, when the memory cells connected to the first word line WL1 and belonging to the strings NS11, NS12, NS13 are programmed, the first word line WL1 and the first string select line SSL1 may be selected. In an exemplary embodiment, as shown in FIG. 3A, the ground select lines GSL1, GSL2, GSL3 may be separated from each other. In another exemplary embodiment, the ground select lines GSL1, GSL2, GSL3 may be connected to each other.

Figure 3B:
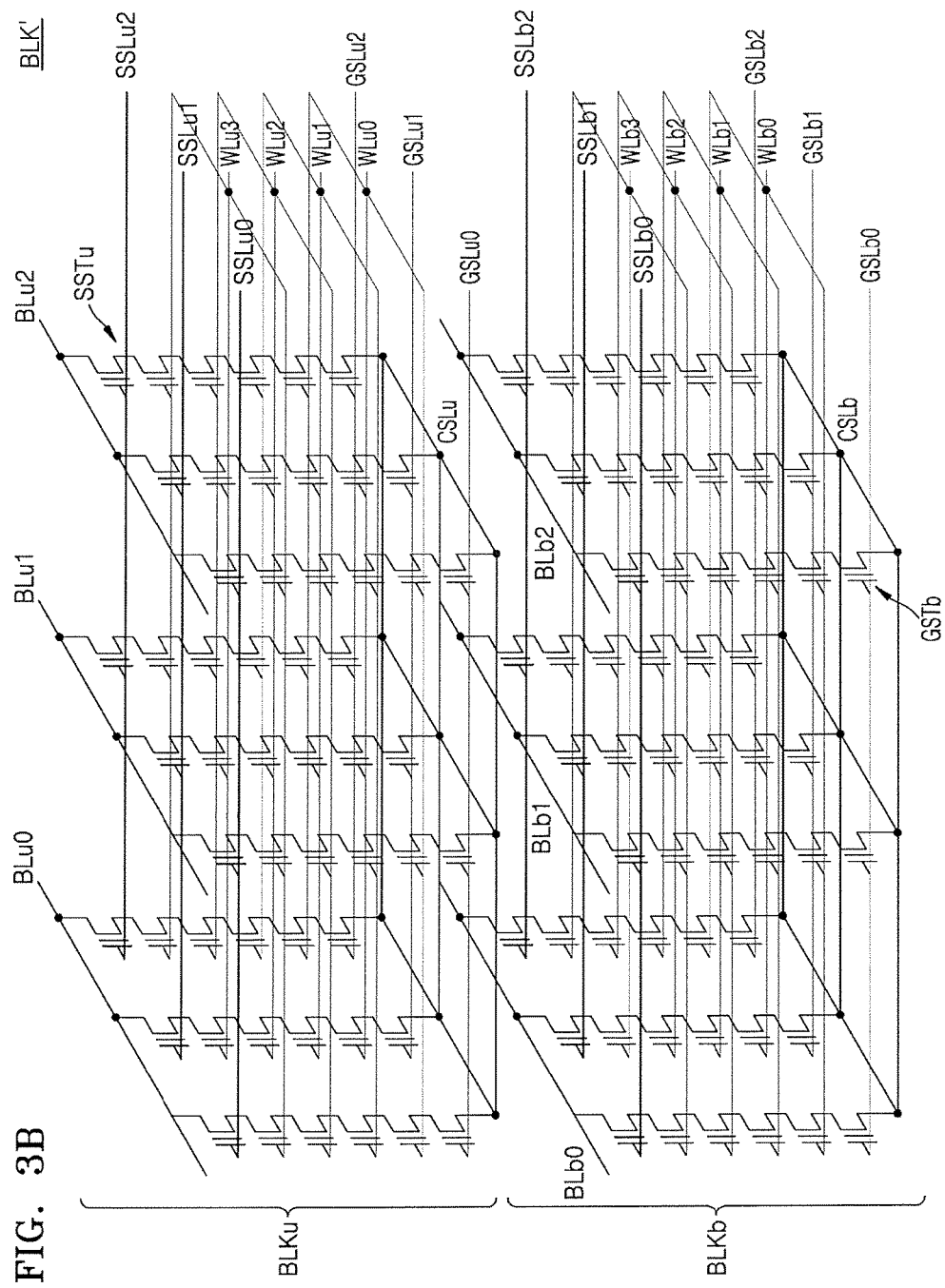

FIG. 3B is a circuit diagram showing an example of the memory block of FIG. 2.

Referring to FIG. 3B, a memory block BLK' may include a plurality of sub-blocks BLKb, BLKu vertically arranged. Specifically, the memory block BLK' may include a lower block BLKb arranged on a substrate, and an upper block BLKu arranged on the lower block BLKb. Each of the lower block BLKb and the upper block BLKu may be a NAND flash memory of a vertical structure.

The lower block BLKb may include a plurality of NAND strings, a plurality of word lines WLb0 to WLb3, a plurality of bit lines BLb0 to BLb2, a plurality of ground select lines GSLb0 to GSLb2, a plurality of string select lines SSLb0 to SSLb2, and a common source line CSLb. Here, the number of NAND strings, the number of word lines, the number of bit lines, the number of ground select lines, and the number of string select lines may be variously changed according to exemplary embodiments.

The upper block BLKu may include a plurality of NAND strings, a plurality of word lines WLu0 to WLu3, a plurality of bit lines BLu0 to BLu2, a plurality of ground select lines GSLu0 to GSLu2, a plurality of string select lines SSLu0 to SSLu2, and a common source line CSLu. The number of NAND strings, the number of word lines, the number of bit lines, the number of ground select lines, and the number of string select lines may be variously changed according to exemplary embodiments.

As such, the lower block BLKb and the upper block BLKu may be substantially similarly realized, and may be realized substantially similarly to the memory block BLK illustrated in FIG. 3A. Thus, details described above with reference to FIG. 3A may also be applied to the present exemplary embodiment, and repeated descriptions will be omitted.

Figure 3C:
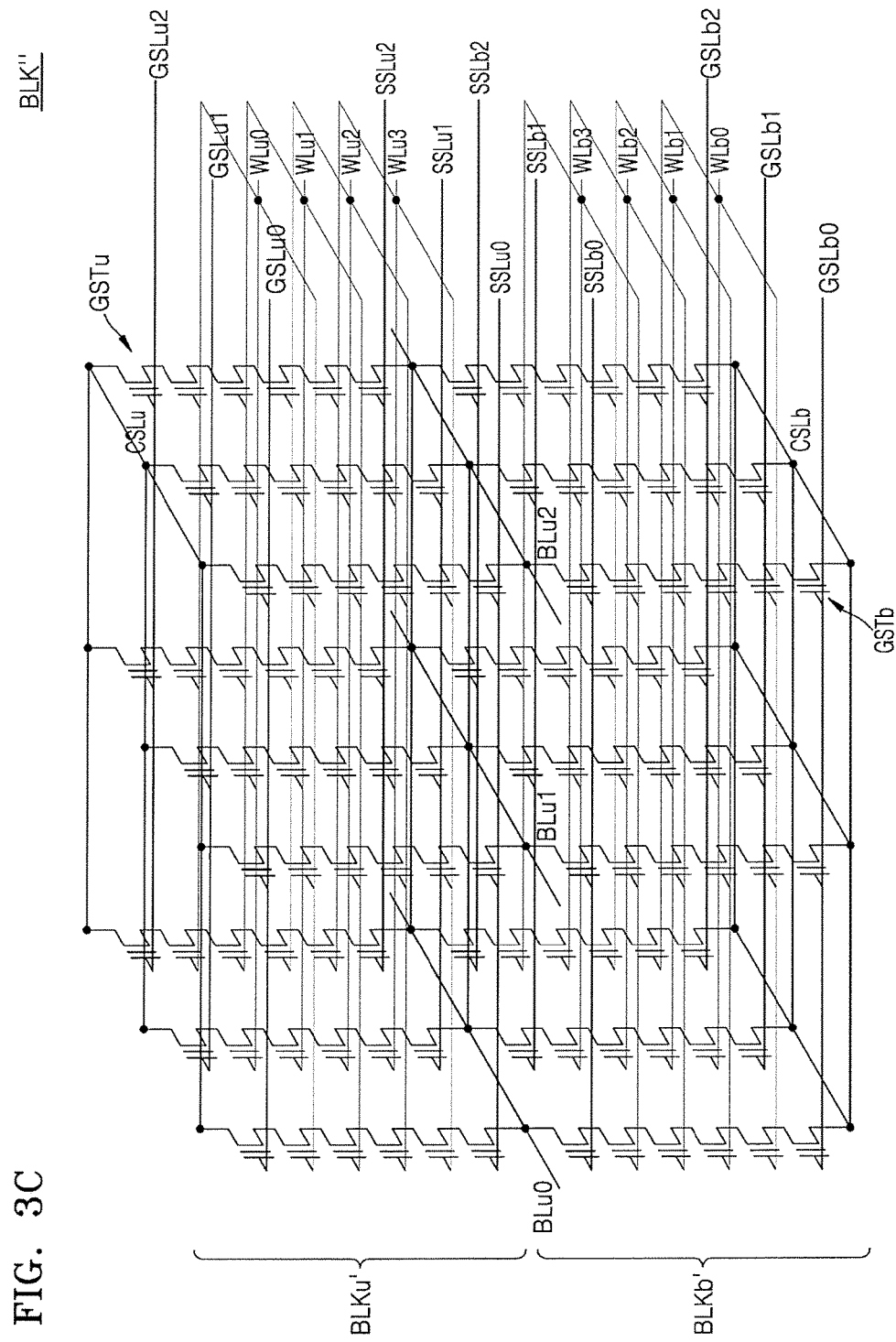

FIG. 3C is a circuit diagram showing an example of the memory block of FIG. 2.

Referring to FIG. 3C, a memory block BLK" may include a plurality of sub-blocks BLKb', BLKu' vertically arranged. Specifically, the memory block BLK" may include a lower block BLKb' arranged on a substrate, and an upper block BLKu' arranged on the lower block BLKb'. Each of the lower block BLKb' and the upper block BLKu' may be a NAND flash memory of a vertical structure. A memory cell array 110" according to the present exemplary embodiment is a modification of the memory block BLK' of FIG. 3B, and differences will be mainly described in detail hereinafter.

The lower block BLKb' may include a plurality of NAND strings, a plurality of word lines WLb0 to WLb3, a plurality of bit lines BLu0 to BLu2, a plurality of ground select lines GSLb0 to GSLb2, a plurality of string select lines SSLb0 to SSLb2, and a common source line CSLb. The number of NAND strings, the number of word lines, the number of bit lines, the number of ground select lines, and the number of string select lines may be variously changed according to exemplary embodiments.

The upper block BLKu' may include a plurality of NAND strings, a plurality of word lines WLu0 to WLu3, a plurality of bit lines BLu0 to BLu2, a plurality of ground select lines GSLb0 to GSLb2, a plurality of string select lines SSLb0 to SSLb2, and a common source line CSLb. The number of NAND strings, the number of word lines, the number of bit lines, the number of ground select lines, and the number of string select lines may be variously changed according to exemplary embodiments.

As such, the upper block BLKu' may be realized in a shape in which the lower block BLKb' is inverted in a perpendicular direction to the substrate, and the upper block BLKu' and the lower block BLKb' may share the plurality of bit lines BLu0 to BLu2. In addition, the upper block BLKu' and the lower block BLKb' may share corresponding word lines. For example, the word line WLu0 and the word line WLb0 may be connected to each other.

In an exemplary embodiment, the ground select lines GSLb0 to GSLb2 included in the lower block BLKb' may be formed, for example, on a P well, and the common source line CSLb may be formed by doping the P well with an impurity. Thus, the P well and the common source line CSLb form a PN junction. Therefore, ground select transistors GSTb included in the lower block BLKb' may be formed in a similar structure to ground select transistors GSTb included in the lower block BLKb of FIG. 3B.

The ground select lines GSLu0 to GSLu2 included in the upper block BLKu' may not be formed on a P well, and the common source line CSLu may be formed, for example, as a metal line. Thus, ground select transistors GSTu included in the upper block BLKu' may be formed in a similar structure to string select transistors SSTu included in the upper block BLKu of FIG. 3B.

Figure 4:
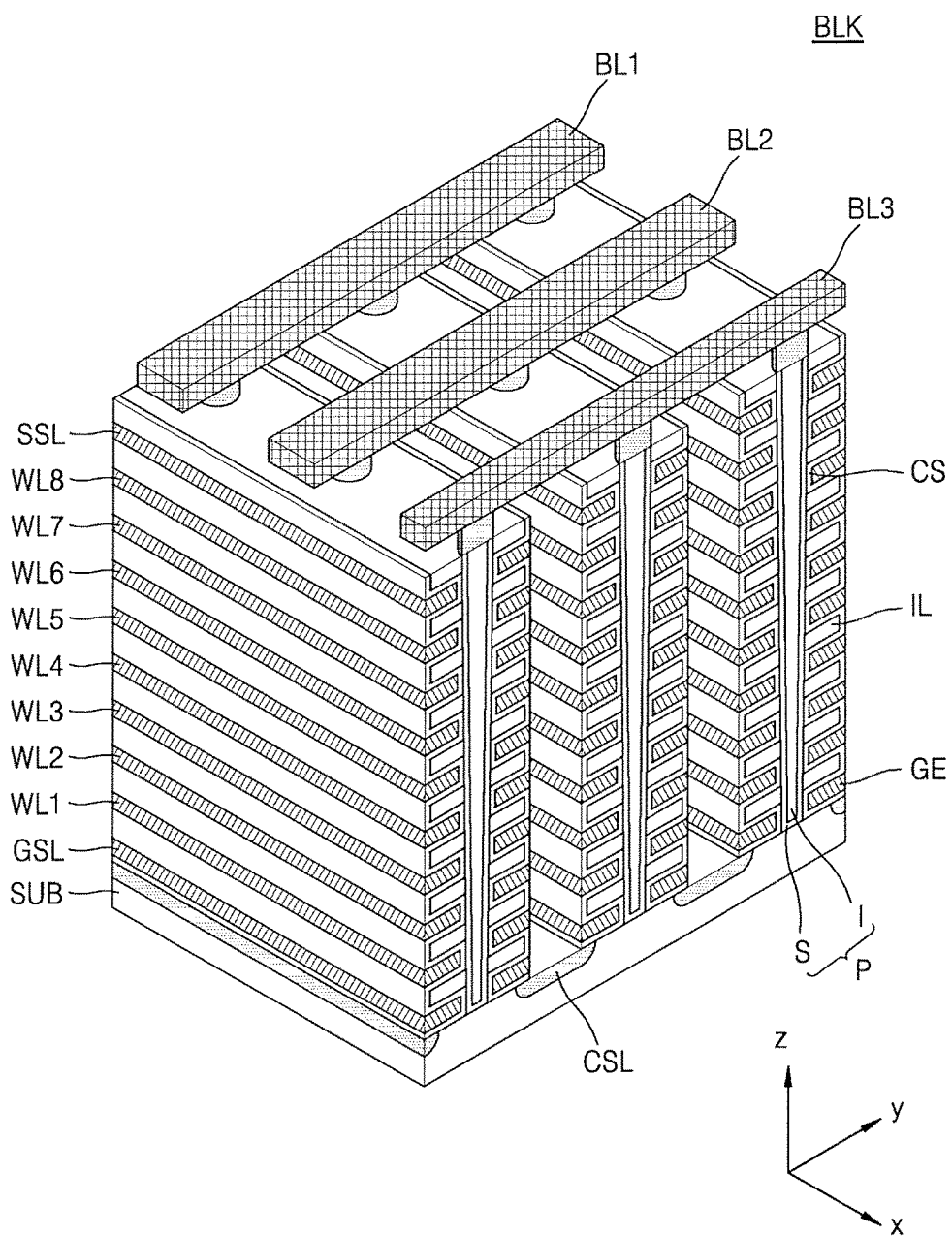
FIG. 4 is a perspective view of a memory block according to the circuit diagram of FIG. 3A.

FIG. 4 is a perspective view of a memory block of FIG. 3.

Referring to FIG. 4, a memory block BLK is formed in a perpendicular direction to a substrate SUB. The substrate SUB may be the first semiconductor layer 10 of FIG. 1. The substrate SUB may have a first conductivity type (for example, a p-type), and a common source line CSL, which extends along a first direction (for example, the x direction) and is doped with impurities of a second conductivity type (for example, an n-type), may be provided on the substrate SUB. The common source line CSL may serve as a source region supplying a current to vertical type memory cells.

On a region of the substrate SUB between two adjoining common source lines CSL, a plurality of insulating layers IL extending along a second direction (for example, the y direction) is sequentially provided along a third direction (for example, the z direction), and the plurality of insulating layers IL is spaced apart from each other by a specific distance along the third direction. For example, the plurality of insulating layers IL may include an insulating material such as silicon oxide.

On the region of the substrate SUB between the two adjoining common source lines CSL, vertical channel structures, which are sequentially arranged along the first direction and penetrate through the plurality of insulating layers IL along the third direction, may be formed. The vertical channel structures may be formed in a cup shape (or a closed-bottom cylinder shape) extending in a vertical direction. Alternatively, the vertical channel structures may be formed in a pillar shape as shown in FIG. 4. Hereinafter, the vertical channel structures will be referred to as pillars. A plurality of pillars P may penetrate through the plurality of insulating layers IL and thus contact the substrate SUB. Specifically, a surface layer S of each of the pillars P may include a silicon material having a first conductivity type, and serve as a channel region. An inner layer I of each of the pillars P may include an insulating material such as silicon oxide, or include an air gap.

In the region between the two adjoining common source lines CSL, a charge storage layer CS is provided along exposed surfaces of the insulating layers IL, the pillars P, and the substrate SUB. For example, the charge storage layer CS may have an oxide-nitride-oxide (ONO) structure. In addition, in the region between the two adjoining common source lines CSL, a gate electrode GE may be provided on an exposed surface of the charge storage layer CS.

Drains or drain contacts are respectively provided on the plurality of pillars P. For example, the drains or drain contacts may include a silicon material doped with impurities having the second conductivity type. On the drains or drain contacts, bit lines BL, which extend in the second direction (for example, the y direction) and are spaced apart by a specific distance along the first direction, may be provided.

Although an exemplary embodiment of the memory block has been described with reference to FIG. 4, the inventive concept is not limited thereto, and the structure of the memory block may be variously modified.

Figure 5A:
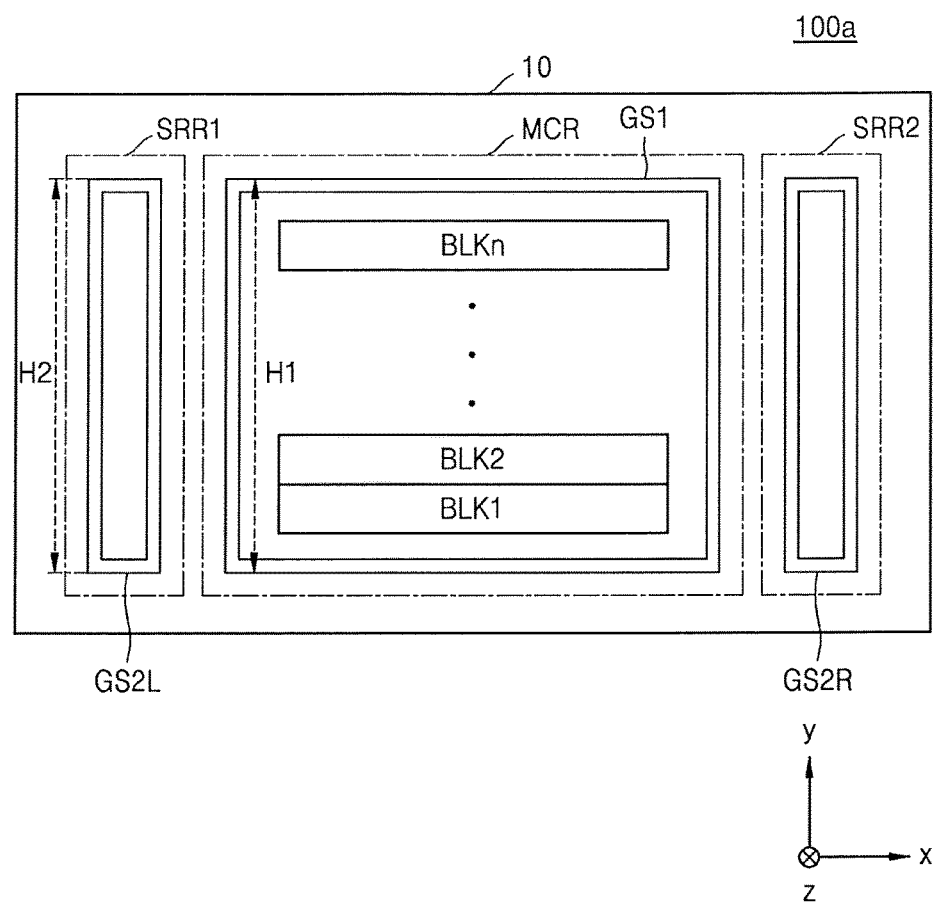
FIGS. 5A to 5C are layout diagrams showing various modifications of a memory device according to an exemplary embodiment of the present inventive concept.
Figure 5B:
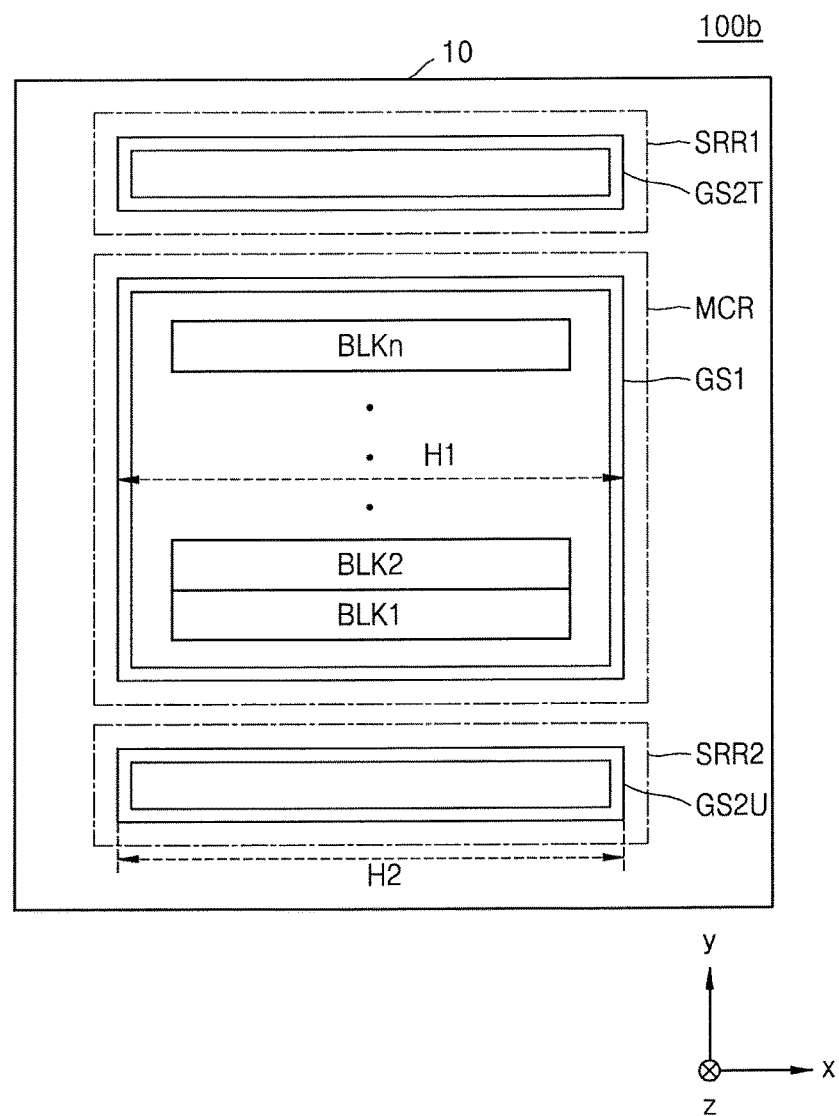
Figure 5C:
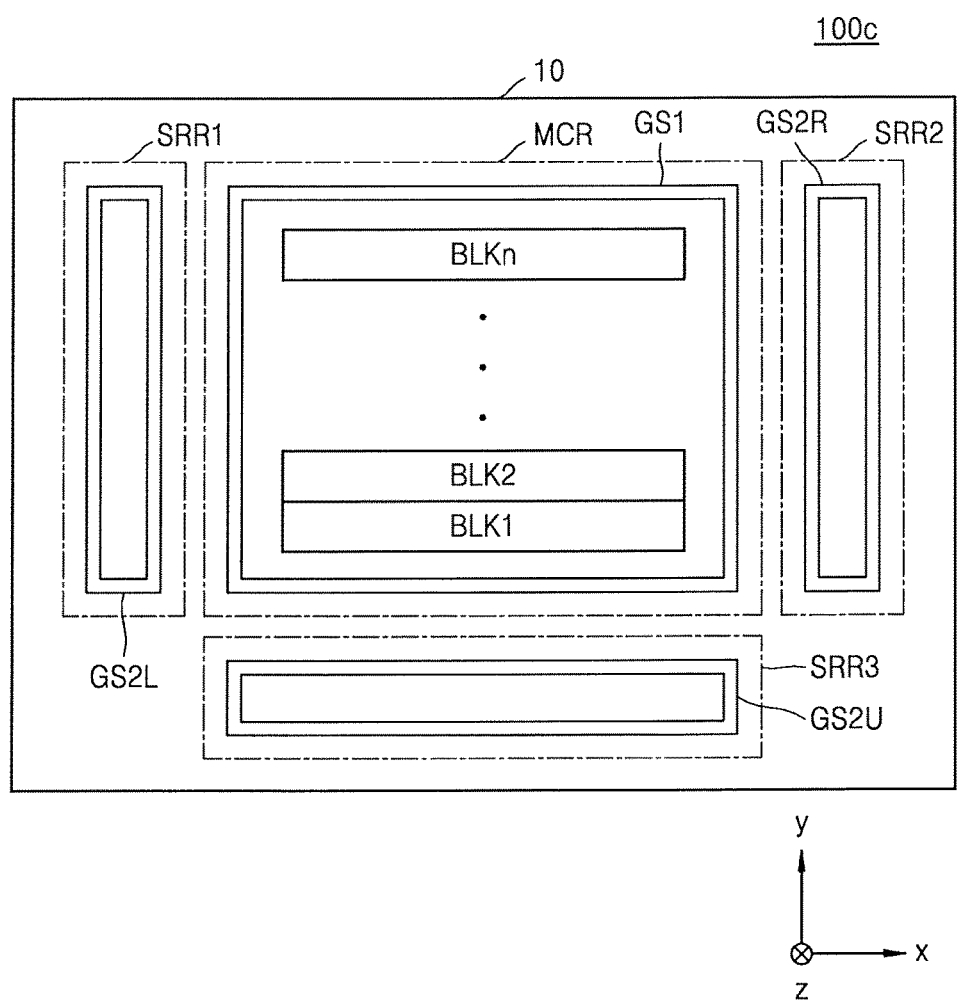

FIGS. 5A to 5C are layout diagrams of a memory device according to exemplary embodiments of the present inventive concept.

As described above with reference to FIG. 1A, in memory devices 100a, 100b, 100c according to exemplary embodiments of the inventive concept, a first gate structure GS1 constituting a memory cell array may be arranged in a memory cell region MCR on a first semiconductor layer 10, and a second gate structure GS2 may be arranged outside the memory cell region MCR. In an exemplary embodiment, a portion of the first semiconductor layer 10 under the second gate structure GS2 may be removed and the first semiconductor layer 10 may not be arranged under the second gate structure GS2. The first gate structure GS1 may be divided into a plurality of memory blocks BLK1, BLK2, . . . , BLKn extending in a first direction (for example, the x direction). A word line cut (not shown) may be arranged along a second direction (for example, the y direction), and arranged between the plurality of memory blocks BLK1, BLK2, . . . , BLKn or between cell strings in the memory blocks.

Referring to FIG. 5A, second gate structures GS2L, GS2R may be arranged parallel to a side of the memory cell region MCR along the first direction. The second gate structures GS2L, GS2R may be formed in peripheral regions SRR1, SRR2. For example, the second gate structures GS2L, GS2R may extend in the second direction. In an exemplary embodiment, a length H2 of the second gate structures GS2L, GS2R in the second direction may be substantially the same as a length H1 of the first gate structure GS1.

The second gate structures GS2L, GS2R are shown as being arranged at both sides of the memory cell region MCR in FIG. 5A. The present inventive concept is not limited thereto. For example, the second gate structure may be arranged at one side out of both sides of the memory cell region MCR.

Referring to FIG. 5B, second gate structures GS2T, GS2U may be arranged parallel to a side of a memory cell region MCR along a second direction. Here, the second gate structures GS2T, GS2U may extend in a first direction. In an exemplary embodiment, a length H2 of the second gate structures GS2T, GS2U in the first direction may be substantially the same as a length H1 of a first gate structure GS1.

The two second gate structures GS2T, GS2U are shown as being arranged at upper and lower sides of the memory cell region MCR in FIG. 5B. The present inventive concept is not limited thereto. For example, the second gate structure may be arranged at one side out of the upper and lower sides of the memory cell region MCR.

In addition, as shown in FIG. 5C, gate structures GS2L, GS2R, GS2U may be arranged parallel to sides of a memory cell region MCR along first and second directions. In an exemplary embodiment, four gate structures may be arranged parallel to four sides of the memory cell region MCR.

As shown in FIGS. 5A to 5C, at least one second gate structure, for example, at least one of GS2L, GS2R, GS2T and GS2U may be formed in the peripheral regions SRR1, SRR2, SRR3 of the memory cell region MCR. The second gate structure may be formed as a circuit element. When a plurality of second gate structures is formed, the plurality of second gate structures may be different kinds of circuit elements. For example, one of the plurality of second gate structures may be a capacitor, and another one may be a test cell array. However, the inventive concept is not limited thereto, and the plurality of second gate structures may be the same kinds of circuit elements.

Figure 6:
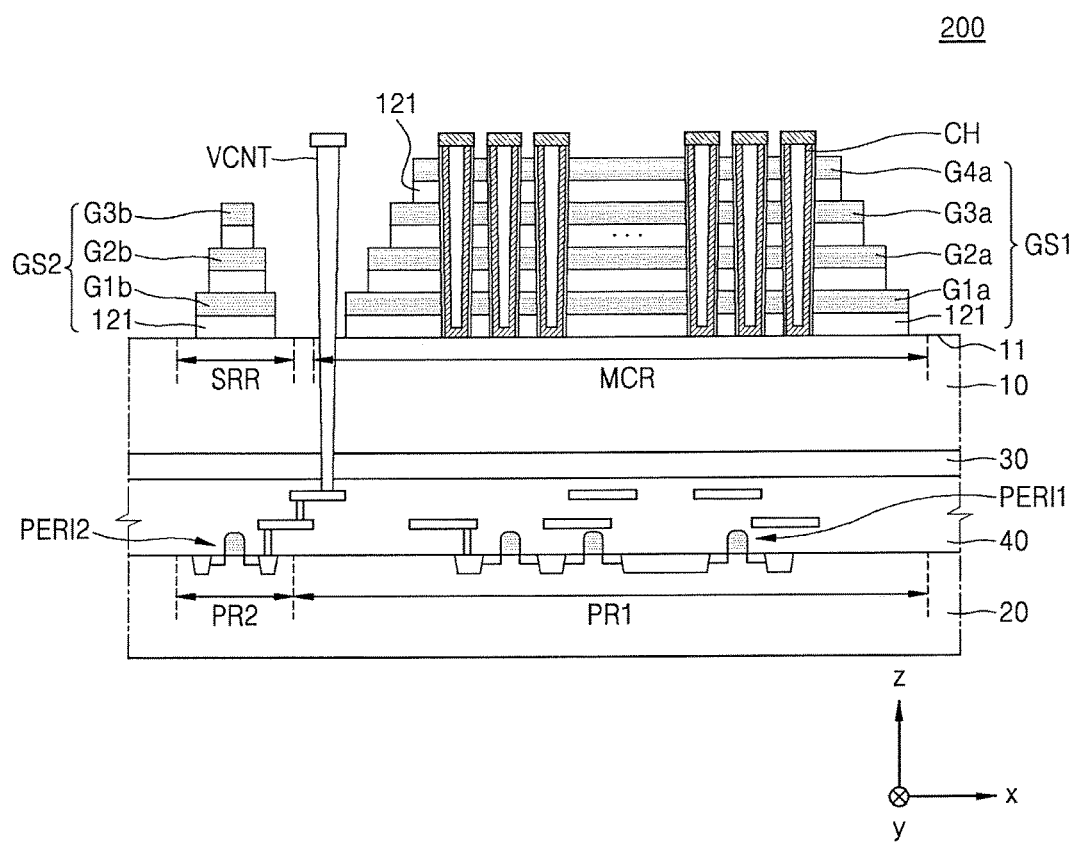
FIG. 6 is a vertical sectional view of a memory device according to an exemplary embodiment of the present inventive concept.

FIG. 6 is a vertical sectional view of a memory device according to an exemplary embodiment of the present inventive concept. FIG. 6 is a schematic sectional view of the memory device taken along line 1B-1B' of FIG. 1A. A layout of a memory device 200 according to an exemplary embodiment is the same as a layout of the memory device of FIG. 1A. Thus, details described with reference to FIG. 1A may also be applied to the present exemplary embodiment.

In the memory device 200 according to an exemplary embodiment, peripheral circuits PERI1, PERI2 may be formed in a first level on a substrate 20, and a memory cell array may be formed in a second level on the substrate 20, which is disposed on an upper side of the peripheral circuits PERI1, PERI2. In an exemplary embodiment, the peripheral circuits PERI1, PERI2 may be part of the substrate 20. For example, the substrate 20 may include the peripheral circuits PERI1, PERI2. This circuit structure of the memory device 200 may be referred to as a cell over peripheral (COP) circuit structure. As used herein, the term "level" refers to a height along a vertical direction (the z direction) from the substrate 20. On the substrate 20, the first level is closer to the substrate 20 than the second level. In an exemplary embodiment, the first level may include part of the substrate 20 in which the peripheral circuits PERI1, PERI2 are formed.

Referring to FIG. 6, the memory device 200 may include the peripheral circuits PERI1, PERI2 formed in the first level on the substrate 20, a first semiconductor layer 10, and a first gate structure GS1 and a second gate structure GS2, which are formed at the second level on the substrate 20. The memory device 200 may further include a wiring layer 40 constituting a wiring structure of the peripheral circuits PERI1, PERI2, and an insulating thin film 30 interposed between the wiring layer 40 and the first semiconductor layer 10.

The substrate 20 may have a main surface extending in a first direction (for example, the x direction) and in a second direction (for example, the y direction). The substrate 20 may include Si, Ge, or SiGe. In an exemplary embodiment, the substrate 20 may include a silicon-on-insulator (SOI) substrate, or a germanium-on-insulator (GeOI) substrate.

The substrate 20 may include peripheral circuit regions PR1, PR2. Thus, the peripheral circuits PERI1, PERI2 may be formed in the peripheral circuit regions PR1, PR2. The peripheral circuits PERI1, PERI2 arranged in the peripheral circuit regions PR1, PR2 may include a page buffer, a latch circuit, a cache circuit, a column decoder, a row decoder, a sense amplifier, a data in/out circuit, or the like.

In an exemplary embodiment, the first peripheral circuit PERI1 may include a page buffer, a latch circuit, a cache circuit, a column decoder, or a sense amplifier, and the second peripheral circuit PERI2 may include a row decoder or a data in/out circuit.

In FIG. 6, although the peripheral circuit regions PR1, PR2 are shown as being separated from each other, the inventive concept is not limited thereto, and various peripheral circuits PERI1, PERI2 may be formed in one peripheral circuit region.

The wiring layer 40 constituting the wiring structure of the peripheral circuits PERI1, PERI2 may be formed on an upper side of the peripheral circuits PERI1, PERI2, and the insulating thin film 30 may be interposed between the wiring layer 40 and the first semiconductor layer 10.

The first semiconductor layer 10 may serve as a substrate on which vertical type memory cells are formed. In an exemplary embodiment, the first semiconductor layer 10 may include impurity-doped polysilicon. For example, the first semiconductor layer 10 may include polysilicon doped with a p-type impurity. The first semiconductor layer 10 may have a height of about 20 nm to about 500 nm from the substrate 20. The height of the first semiconductor layer 10 according to an exemplary embodiment is not limited thereto.

As described above with reference to FIGS. 1A and 1B, a memory cell region MCR and a peripheral region SRR are formed on the first semiconductor layer 10. The memory cell region MCR is a region in which the vertical type memory cells are arranged, and a first gate structure GS1 constituting the vertical type memory cell array is arranged in the memory cell region MCR on the first semiconductor layer 10. A second gate structure GS2 is arranged in the peripheral region SRR on the first semiconductor layer 10. In an exemplary embodiment, a portion of the first semiconductor layer 10 under the second gate structure GS2 may be removed and the first semiconductor layer 10 may not be arranged under the second gate structure GS2. The first gate structure GS1 and the second gate structure GS2 may be electrically connected to the peripheral circuits PERI1, PERI2 through a vertical contact VCNT penetrating through the first semiconductor layer 10 and the insulating thin film 30, and the wiring layer 40.

In an exemplary embodiment, the second gate structure GS2 may be arranged on an upper side of the second peripheral circuit PERI2. The second gate structure GS2 as well as the first gate structure GS1 is arranged on the upper side of the peripheral circuits PERI1, PERI2. In this case, an additional space for arrangement of the second gate structure GS2 is not required, and thus a layout area of the memory device 200 may be reduced.

Figure 7A:
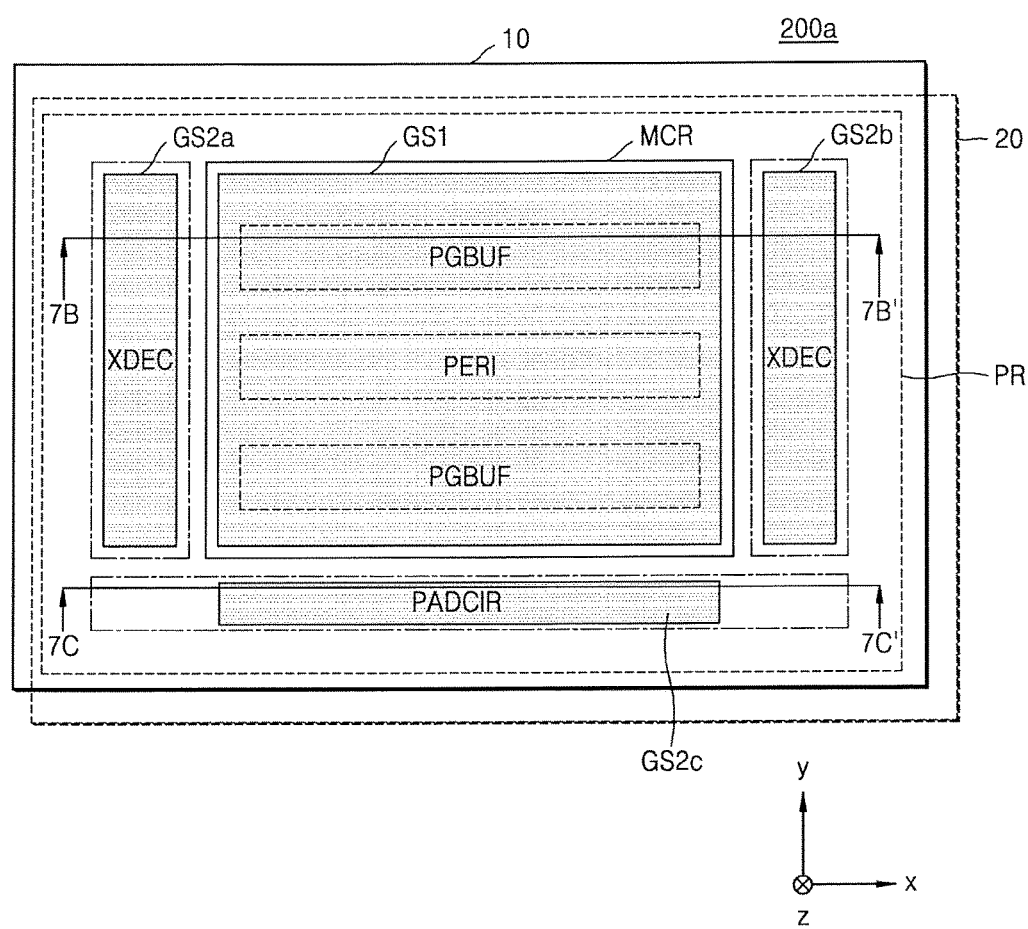
FIGS. 7A to 7C are schematic diagrams showing a main configuration of a memory device according to an exemplary embodiment of the present inventive concept.
Figure 7B:
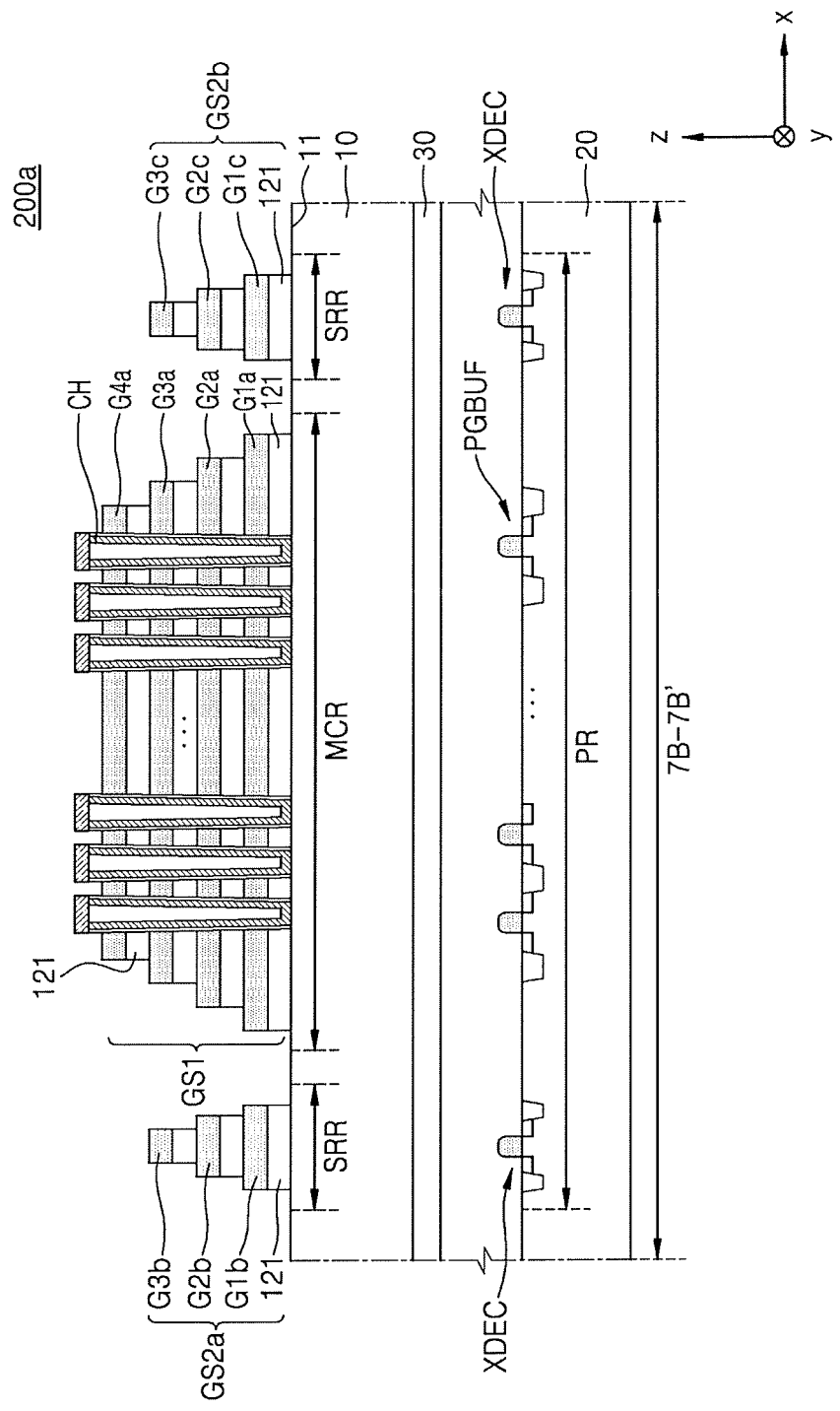
Figure 7C:
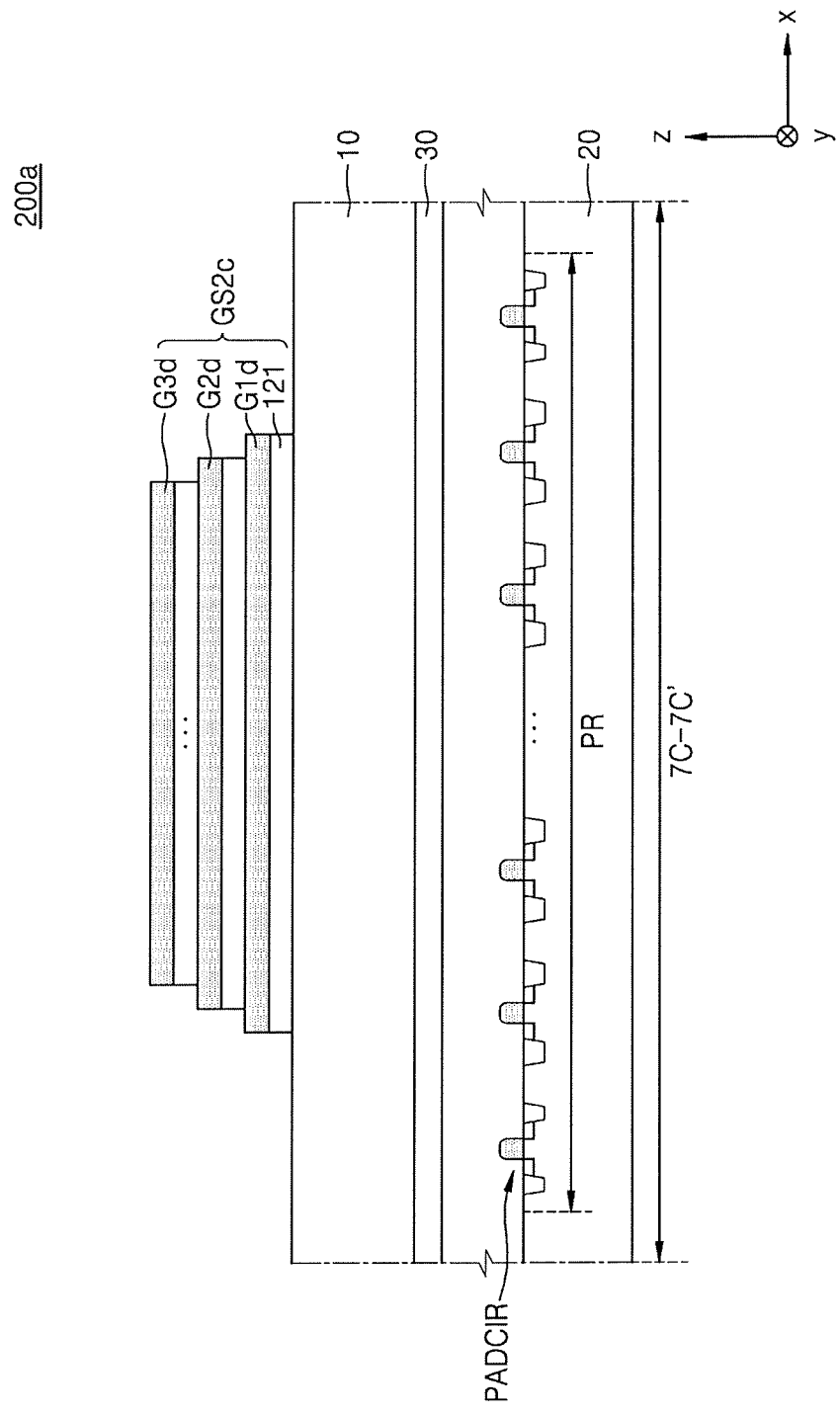

FIGS. 7A to 7C are schematic diagrams showing a main configuration of a memory device according to an exemplary embodiment of the present inventive concept. FIGS. 7A to 7C are diagrams of a memory device having a COP circuit structure. FIG. 7A is a layout diagram of a memory device, FIG. 7B is a schematic sectional view of the memory device taken along line 7B-7B' of FIG. 7A, and FIG. 7C is a schematic sectional view of the memory device taken along line 7C-7C' of FIG. 7A.

For the convenience of description, in FIG. 7A, a circuit formed in a first level on a substrate 20 is shown by a dotted line, and a circuit formed in a second level on the substrate 20, for example, a circuit formed on a first semiconductor layer 10 is shown by a solid line.

Referring to FIG. 7A, a peripheral circuit region PR may be formed on the substrate 20, and various peripheral circuits XDEC, PGBUF, PERI, PADCIR (shown by a dotted line) may be formed in the peripheral circuit region PR. The peripheral circuits may be arranged according to locations of a memory cell region MCR. Some peripheral circuits (referred to as a first peripheral circuit hereinafter) may be arranged on a lower side of the memory cell region MCR, and other peripheral circuits (referred to as a second peripheral circuit hereinafter) may be arranged at the periphery of the first peripheral circuit.

As shown in FIGS. 7A to 7B, the first peripheral circuit may include a page buffer PGBUF and other peripheral circuits PERI, and the second peripheral circuit may include a row decoder XDEC and a pad circuit PADCIR. The other peripheral circuits PERI may include, for example, a latch circuit, a cache circuit, or a sense amplifier. The pad circuit PADCIR may include an electrostatic discharge (ESD) element or a data input/output circuit. The present inventive concept is not limited thereto. For example, the peripheral circuits which are respectively included in the first and second peripheral circuits may be variously changed. Hereinafter, for the convenience of description, an exemplary embodiment in which the first peripheral circuit includes the page buffer PGBUF and the other peripheral circuits PERI and the second peripheral circuit includes the row decoder XDEC and the pad circuit PADCIR will be described in detail.

The page buffer PGBUF and the other peripheral circuits PERI may overlap a memory cell array having a first gate structure GS1 in a perpendicular direction to the substrate 20 (for example, the z direction). Second gate structures GS2a, GS2b, GS2c may be formed on an upper side of the row decoder XDEC and the pad circuit PADCIR. The row decoder XDEC and the pad circuit PADCIR may overlap the second gate structure GS2 in the perpendicular direction to the substrate 20.

Referring to FIG. 7B, on the substrate 20, the page buffer PGBUF may be formed in a central portion of the peripheral circuit region PR, and the row decoder XDEC may be formed in the periphery of the peripheral circuit region PR. The first gate structure GS1 constituting a memory cell array may be formed on an upper side of the page buffer PGBUF, and may overlap a portion or all of the page buffer PGBUF. The second gate structures GS2a, GS2b may be formed at both sides of the first gate structure GS1. The second gate structures GS2a, GS2b may be formed on an upper side of the row decoder XDEC, and may overlap a portion or all of the row decoder XDEC.

Referring to FIG. 7C, the pad circuit PADCIR may be formed in the peripheral circuit region PR on the substrate 20. The pad circuit PADCIR may be arranged in a first direction (for example, the x direction). The second gate structure GS2c may be formed on an upper side of the pad circuit PADCIR. The second gate structure GS2c may also extend in the first direction. In an exemplary embodiment, a length of the second gate structure GS2c in the first direction may be the same as a length of the first gate structure GS1 in the first direction.

Figure 8A:
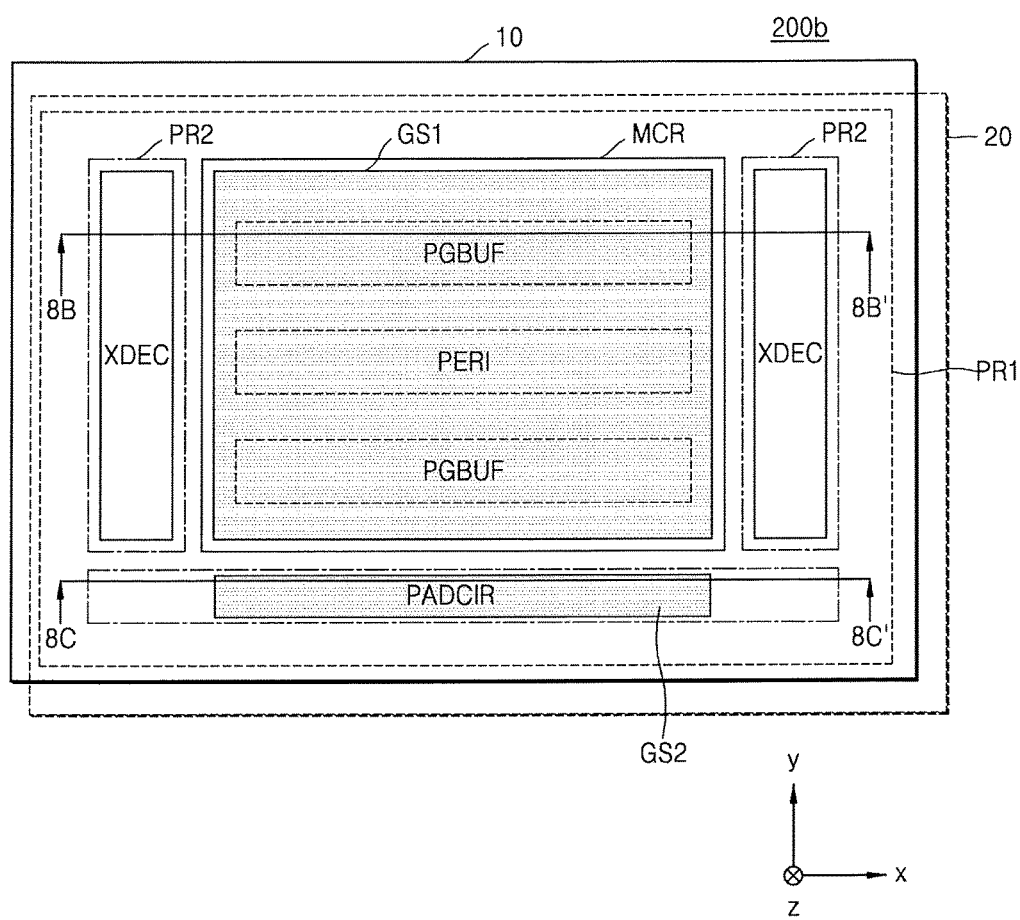
FIGS. 8A to 8C are schematic diagrams showing a main configuration of a memory device according to an exemplary embodiment of the present inventive concept.
Figure 8B:
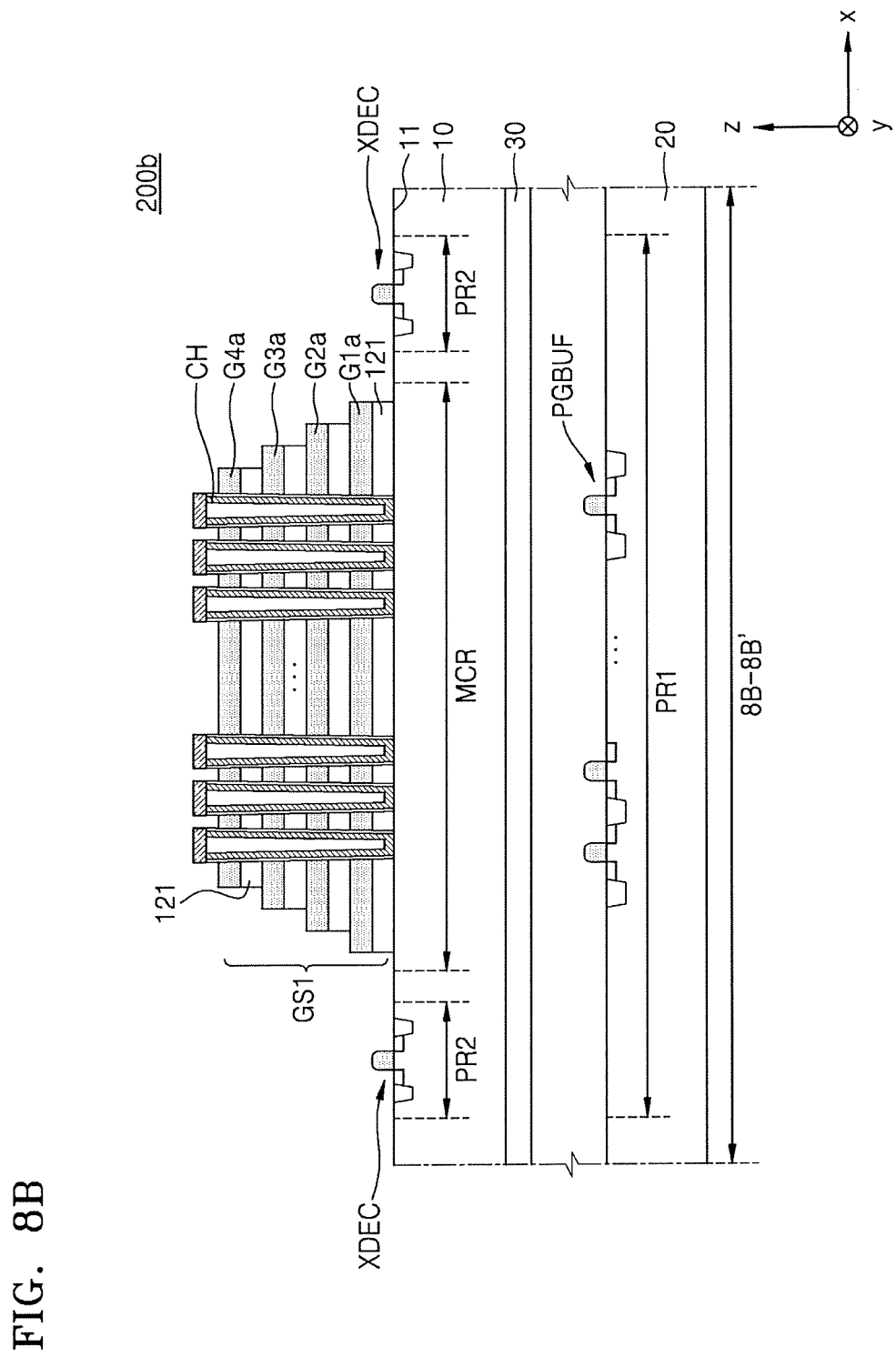
Figure 8C:
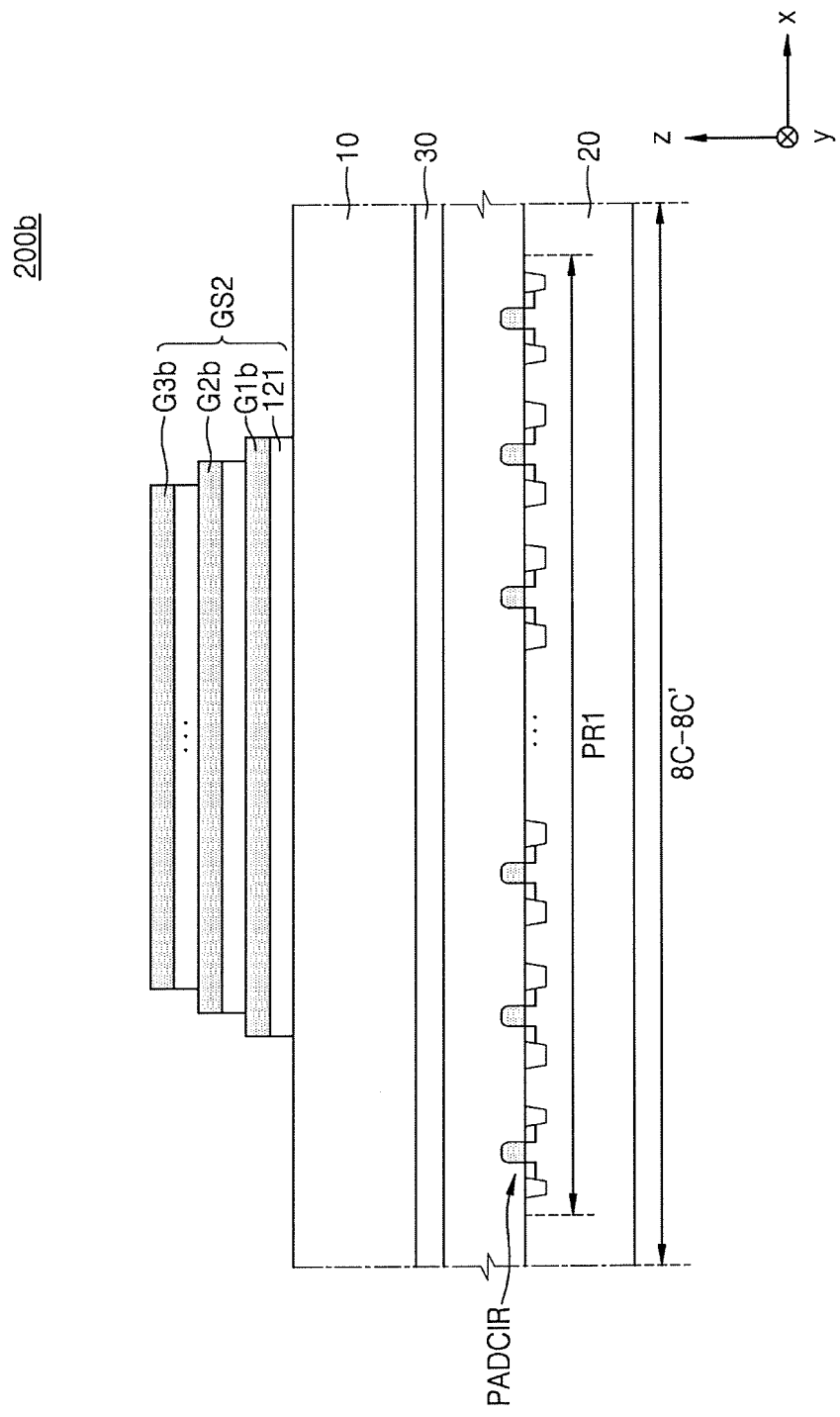

FIGS. 8A to 8C are schematic diagrams showing a main configuration of a memory device according to an exemplary embodiment of the present inventive concept. FIGS. 8A to 8C are diagrams of a memory device having a COP circuit structure. FIG. 8A is a layout diagram of a memory device, FIG. 8B is a schematic sectional view of the memory device taken along line 8B-8B' of FIG. 8A, and FIG. 8C is a schematic sectional view of the memory device taken along line 8C-8C' of FIG. 8A.

For the convenience of description, in FIG. 8A, a circuit formed in a first level on a substrate 20 is shown by a dotted line, and a circuit formed in a second level on the substrate 20, that is, a circuit formed on a first semiconductor layer 10 is shown by a solid line.

Referring to FIGS. 8A to 8C, a first peripheral circuit region PR1 may be formed on the substrate 20, and a memory cell region MCR and a second peripheral circuit region PR2 may be formed on the first semiconductor layer 10. Thus, some peripheral circuits may be formed in the first level on the substrate 20, and other peripheral circuits may be formed in the second level on the substrate 20. For example, the other peripheral circuits may be formed on the first semiconductor layer 10 like a first gate structure GS1 constituting a memory cell array. For example, a row decoder XDEC may be formed on the first semiconductor layer 10. As shown in FIG. 8B, the row decoder XDEC may be formed in the second peripheral circuit region PR2 arranged at both sides of the memory cell region MCR.

A second gate structure GS2 may be arranged at another side of the memory cell region MCR. As shown in FIG. 8A, the second gate structure GS2 may be arranged at a lower side of the memory cell region MCR. As shown in FIGS. 8A and 8C, the second gate structure GS2 may overlap a pad circuit PADCIR in a perpendicular direction to the substrate 20.

A peripheral circuit, for example, the row decoder XDEC arranged in the second peripheral circuit region PR2, and the first and second gate structures GS1, GS2 may be formed by different fabrication processes. After the row decoder XDEC is formed on the first semiconductor layer 10, the first gate structure GS1 and the second gate structure GS2 may be formed. In an exemplary embodiment, a portion of the first semiconductor layer 10 under the second gate structure GS2 may be removed and the first semiconductor layer 10 may not be arranged under the second gate structure GS2.

Figure 9:
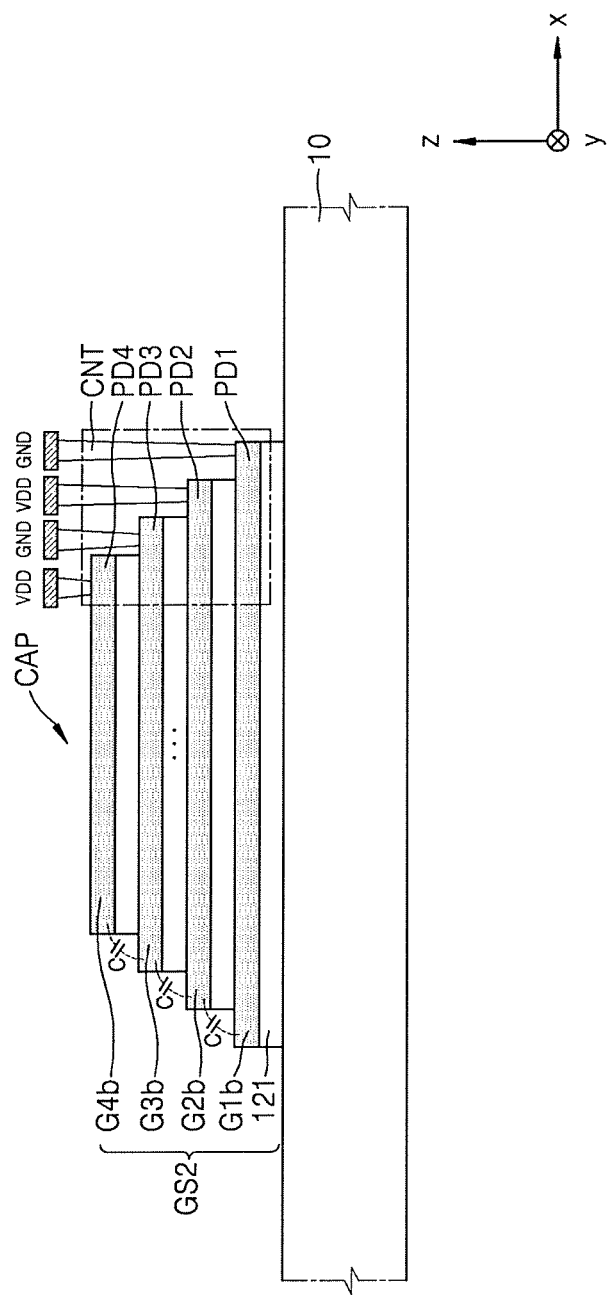
FIG. 9 is a diagram showing an example of use of a second gate structure according to an exemplary embodiment of the present inventive concept.

FIG. 9 is a diagram showing an example of use of a second gate structure according to an exemplary embodiment of the present inventive concept.

Referring to FIG. 9, a portion or all of a second gate structure GS2 (for example, the second gate structure described with reference to FIGS. 1A to 8C) formed outside a memory cell region may constitute a capacitor CAP. The second gate structure GS2 may include a step-shaped edge region. Edge regions of a plurality of electrodes G1b, G2b, G3b, G4b may be respectively referred to as pads PD1, PD2, PD3, PD4. A voltage may be applied to some or all of the pads through a contact CNT. Here, different voltages may be applied to adjoining pads. For example, a first voltage GND may be applied to the first and third pads PD1, PD3, and a second voltage VDD may be applied to the second and fourth pads PD2, PD4. Sub capacitors C may be formed between two adjacent electrodes of the plurality of electrodes G1b, G2b, G3b, G4b. The sub capacitors C may be connected in series to form the capacitor CAP. Thus, the second gate structure GS2 may be operated as a capacitor.

As described above with reference to FIG. 1A, a process of forming a second gate structure GS2 is the same as a process of forming the first gate structure GS1 in FIG. 1A. Thus, a separate process for forming a capacitor including the second gate structure GS2 is not required. A capacitor may be formed in an extra space at the periphery of the memory cell region MCR in FIG. 1A without increasing a layout area. In addition, since an area for forming the capacitor in the memory device is relatively large, the capacitor may have good electrical properties.

Figure 10:
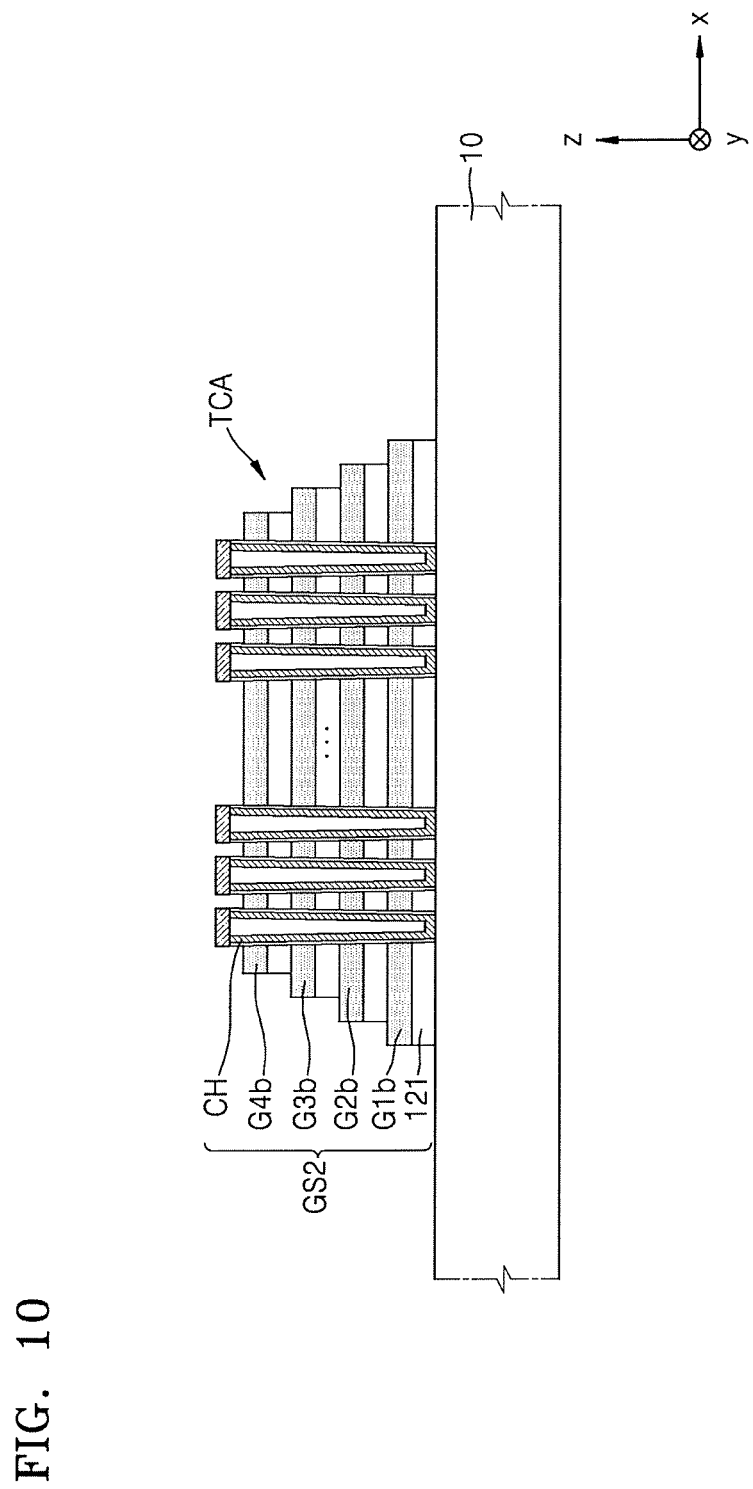
FIG. 10 is a diagram showing an example of use of a second gate structure according to an exemplary embodiment of the present inventive concept.

FIG. 10 is a diagram showing an example of use of a second gate structure according to an exemplary embodiment of the present inventive concept.

Referring to FIG. 10, a portion or all of a second gate structure GS2 (for example, the second gate structure described with reference to FIGS. 1A to 8C) formed outside a memory cell region may constitute a test cell array TCA.

The second gate structure GS2 may include a plurality of gate electrodes G1b, G2b, G3b, G4b and a plurality of vertical channel structures CH. A bit line may be connected to an upper portion of the plurality of vertical channel structures, and a contact may be connected to an edge region of the second gate structure GS2, although the bit line and the contact are not shown in FIG. 10. The plurality of gate electrodes G1b, G2b, G3b, G4b and one vertical channel structure CH may constitute a test cell string. Thus, the plurality of gate electrodes G1b, G2b, G3b, G4b and the plurality of vertical channel structures CH may constitute a test cell array TCA.

In an exemplary embodiment, the test cell array TCA may be used to test electrical properties of a memory cell array. For example, the test cell array TCA may be used to test write, read, and erase characteristics for a memory cell array. In an exemplary embodiment, the test cell array TCA may be used to measure a resistance level or parasitic capacitance of gate electrodes of the memory cell array. In an exemplary embodiment, the test cell array TCA may be used for various tests relating to operations of the memory cell array.

In an exemplary embodiment, the test cell array TCA may be programmed with preset conditions, and thus be used as a general transistor. For example, the test cell array TCA may constitute a portion of peripheral circuits. Test cell array TCA may be used as a portion of a row decoder XDEC or pad circuit PADCIR.

Since the test cell array TCA may replace the memory cell array or be used as a portion of the peripheral circuits, the memory device 100 may perform a test operation for the test cell array TCA itself, and thereby determine whether the test cell array TCA may be normally operated.

Figure 11A:
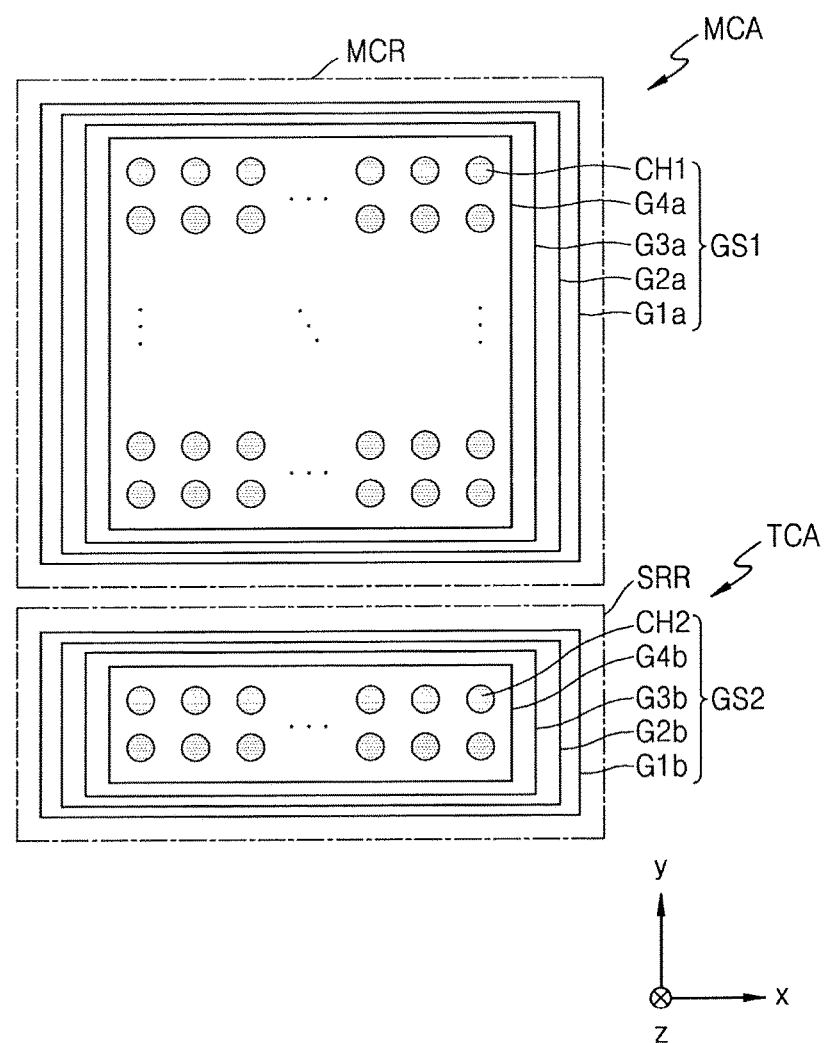
FIGS. 11A and 11B are plan views showing exemplary embodiments of the second gate structure of FIG. 10.
Figure 11B:
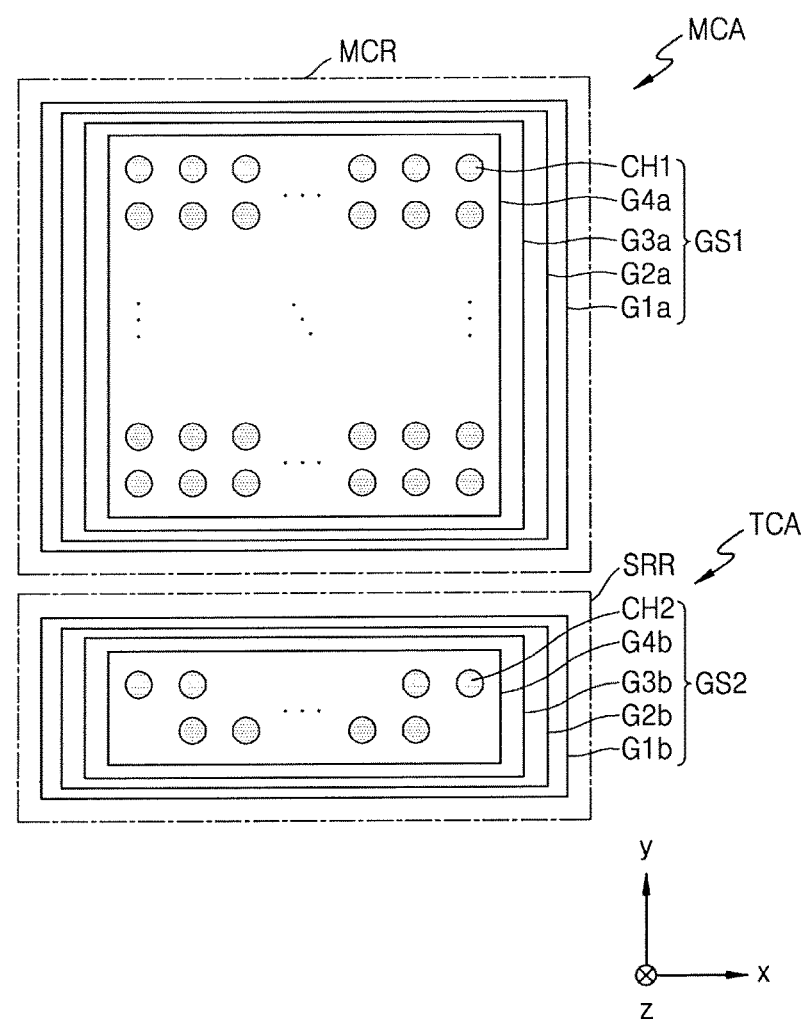

FIGS. 11A and 11B are plan views showing exemplary embodiments of the second gate structure of FIG. 10.

Referring to FIG. 11A, the number of gate electrodes G1b, G2b, G3b, G4b included in the second gate structure GS2 may be the same as the number of gate electrodes G1a, G2a, G3a, G4a included in a first gate structure GS1. In addition, an arrangement shape of a plurality of vertical channel structures CH2 (referred to as second vertical channel structures hereinafter) included in the second gate structure GS2 may be the same as an arrangement shape of a plurality of vertical channel structures CH1 (referred to as first vertical channel structures hereinafter) included in the first gate structure GS1. Although the plurality of first vertical channel structures CH1 is shown as being arranged side by side, this is merely an example, and the arrangement shape of the plurality of first vertical channel structures CH1 may be variously changed. The plurality of second vertical channel structures CH2 may be arranged according to the arrangement shape of the plurality of first vertical channel structures CH1.

As such, a structure of the test cell array TCA may be the same as that of a memory cell array MCA. The test cell array TCA may be used for various tests relating to the memory cell array MCA. In an exemplary embodiment, the test cell array TCA may be used for a test relating to operations of the memory cell array MCA. In an exemplary embodiment, when the memory cell array MCA needs to be subjected to a test which might cause damage thereto, the test cell array TCA may be used for the test in place of the memory cell array MCA. For example, when a test in which high-level voltages are applied to a memory cell needs to be performed, the test cell array TCA may be used for the test.

Referring to FIG. 11B, unlike in FIG. 11A, an arrangement shape of a plurality of second vertical channel structures CH2 may be different from an arrangement shape of a plurality of first vertical channel structures CH1. In addition, the number of gate electrodes G1b, G2b, G3b, G4b included in a second gate structure GS2 may be different from the number of gate electrodes G1a, G2a, G3a, G4a included in a first gate structure GS1. Thus, a structure of a test cell array TCA may be different from that of a memory cell array MCA. The test cell array TCA may be used for a test for examining characteristics of a new memory cell array having a different structure from the memory cell array MCA.

Figure 12:
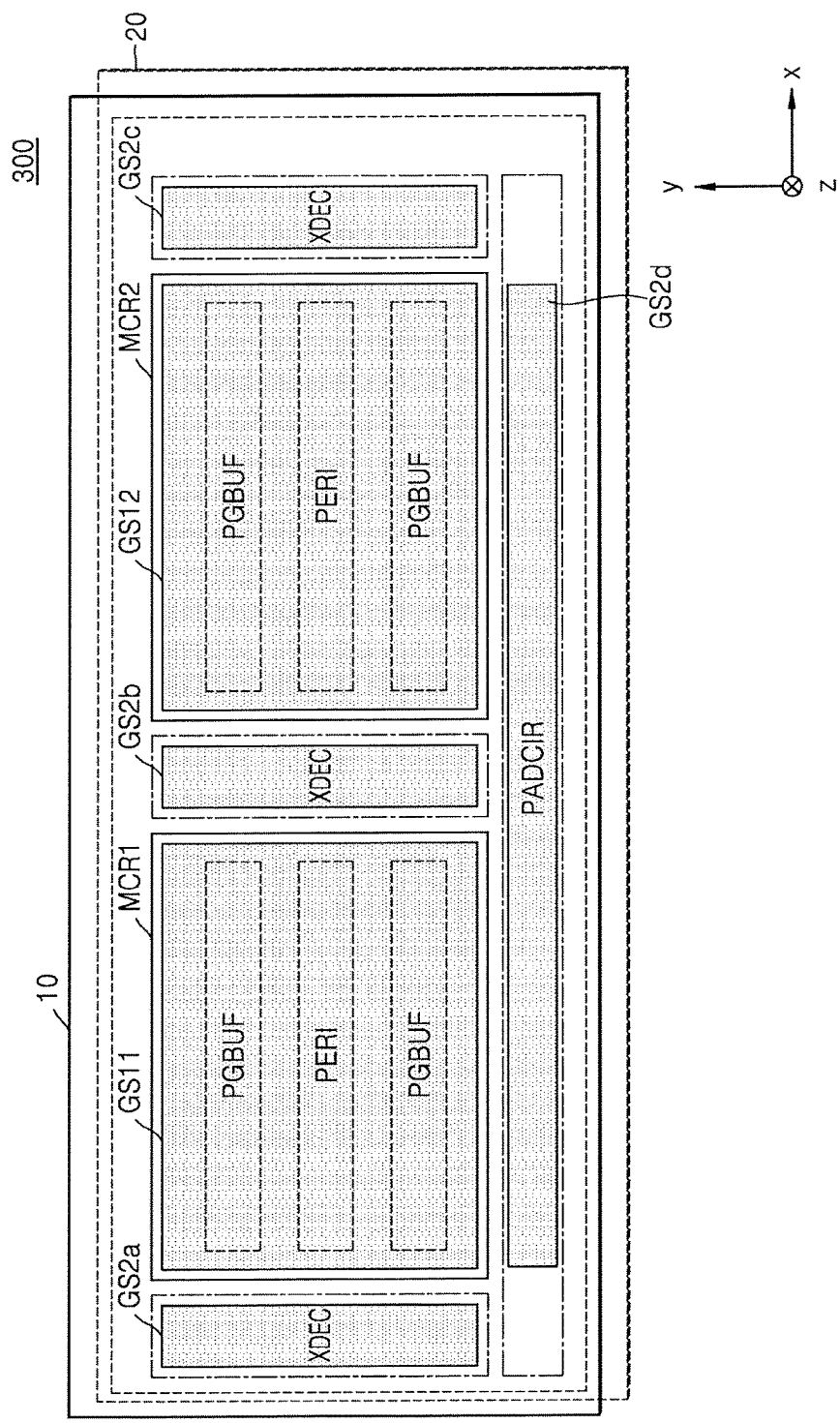
FIG. 12 is a diagram showing a memory device according to an exemplary embodiment of the present inventive concept.

FIG. 12 is a diagram showing a memory device according to an exemplary embodiment of the present inventive concept.

A memory device 300 may be a memory device having a COP circuit structure.

For the convenience of description, in FIG. 12, a circuit formed in a first level on a substrate 20 is shown by a dotted line, and a circuit formed in a second level on the substrate 20, that is, a circuit formed on a first semiconductor layer 10 is shown by a solid line.

Referring to FIG. 12, the memory device 300 may include a plurality of memory cell arrays. A plurality of memory cell regions MCR1, MCR2 may be formed on the first semiconductor layer 10. First gate structures GS11, GS12 may be respectively formed in the plurality of memory cell regions MCR1, MCR2. The first gate structures GS11, GS12 may respectively constitute memory cell arrays. Each of the memory cell arrays may include a plurality of memory blocks. The memory cell arrays may respectively receive signals from different row decoders XDEC. For example, the first gate structures GS11, GS12 may individually receive signals from the row decoders XDEC.

In a region on the substrate 20 overlapping the first gate structures GS11, GS12, first peripheral circuits, for example, a page buffer PGBUF and other peripheral circuits PERI may be formed. In the periphery of the first peripheral circuits, second peripheral circuits, for example, a row decoder XDEC and a pad circuit PADCIR may be formed. In a region on the first semiconductor layer 10 overlapping the second peripheral circuits, second gate structures GS2a, GS2b, GS2c, GS2d may be formed. In an exemplary embodiment, a portion of the first semiconductor layer 10 under the second gate structure GS2 may be removed and the first semiconductor layer 10 may not be arranged under the second gate structure GS2. The second gate structures GS2a, GS2b, GS2c, GS2d may be formed outside the plurality of memory cell regions MCR1, MCR2, and may overlap a portion or all of the second peripheral circuits in a perpendicular direction to the substrate 20 (for example, the z direction).

In FIG. 12, although the peripheral circuits are shown as being formed on the substrate 20, the inventive concept is not limited thereto. Some peripheral circuits may be formed on the first semiconductor layer 10. For example, the row decoder XDEC may be formed on the first semiconductor layer 10, and may be arranged at at least one side of the memory cell regions MCR1, MCR2. Here, the second gate structure may be arranged at another side at which the row decoder XDEC is not arranged, among sides of the memory cell regions MCR1, MCR2, and may overlap the peripheral circuits formed on the substrate 20 in the perpendicular direction to the substrate 20.

Figure 13A:
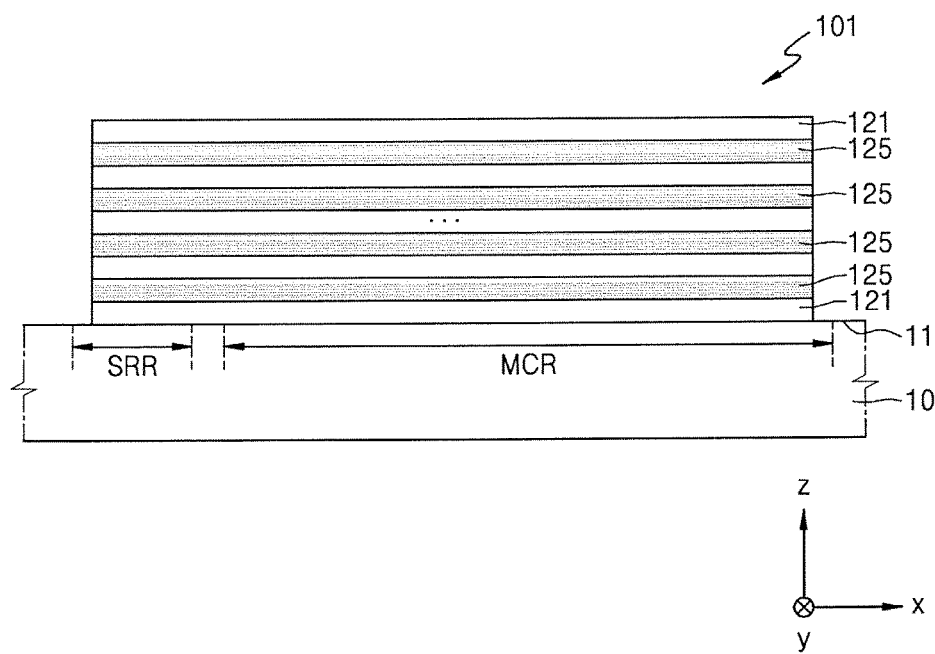
FIGS. 13A to 13C are sectional views according to a process order for explaining a method of fabricating a memory device according to exemplary embodiments of the present inventive concept.
Figure 13B:
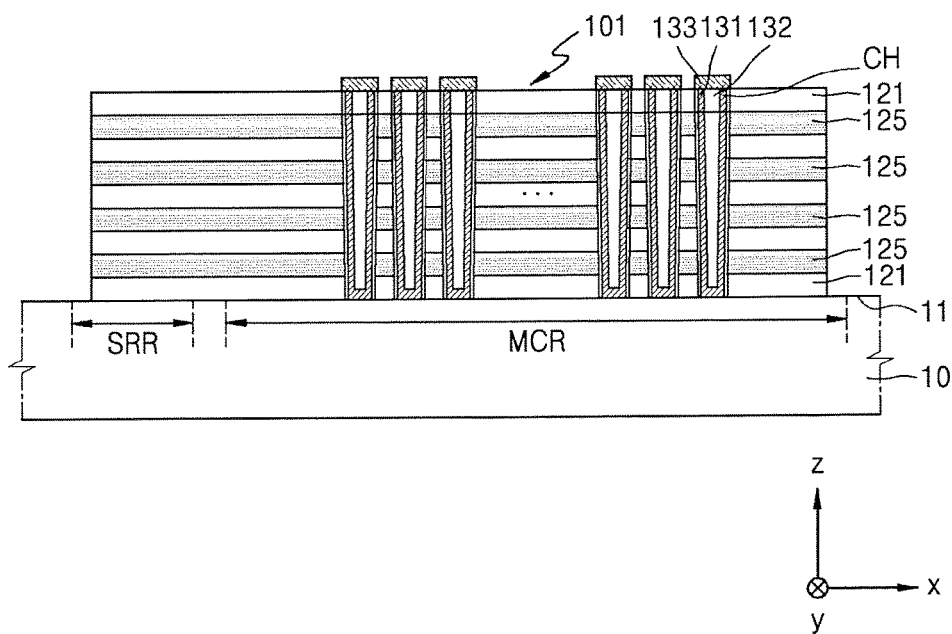
Figure 13C:
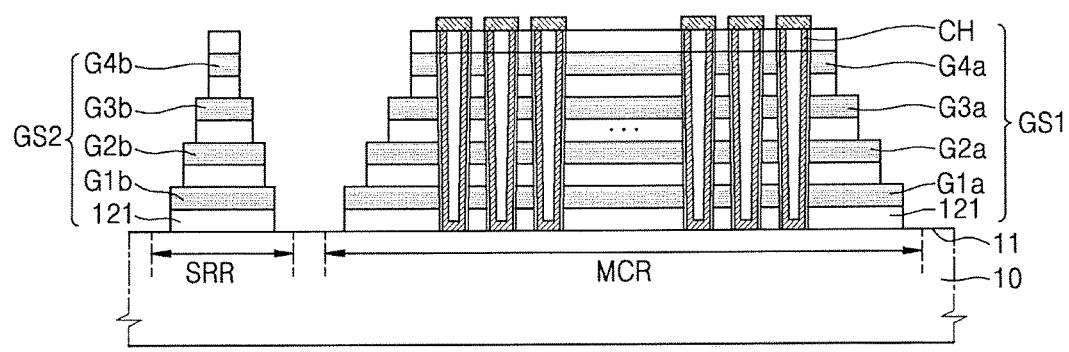
Figure 13C:
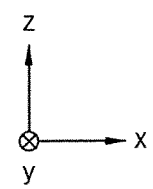

FIGS. 13A to 13C are sectional views according to a method of fabricating a memory device according to an exemplary embodiment of the present inventive concept.

Referring to FIG. 13A, a memory cell region MCR and a peripheral region SRR may be formed on a first semiconductor layer 10, and a gate stack 101 may be formed by alternately stacking a gate electrode insulating layer 121 and a gate conductive layer 125.

In an exemplary embodiment, a well region may be formed by doping an upper portion of the first semiconductor layer 10 with a first impurity, thereby forming the memory cell region MCR and the peripheral region SRR. Here, the first impurity may be a p-type impurity. The first impurity may be doped by an ion implantation process. In an exemplary embodiment, the memory cell region MCR and the peripheral region SRR may be well regions separated from each other. However, the inventive concept is not limited thereto, and the memory cell region MCR and the peripheral region SRR may be formed in the same well region.

The gate electrode insulating layer 121 may include an insulator such as a silicon oxide film or a silicon nitride film, and the gate conductive layer 125 may include a conductor such as silicon or a metal.

Referring to FIG. 13B, a vertical channel structure CH penetrating through the gate stack 101 may be formed. The vertical channel structure CH may have a pillar shape. In an exemplary embodiment, the vertical channel structure CH may have a cylinder shape. A plurality of vertical channel structures CH, which is spaced apart from each other in a first direction (the x direction) and in a second direction (the y direction), may be formed. An upper surface of the first semiconductor layer 10 may be exposed to a lower end of the vertical channel structure CH. Although the vertical channel structures CH are shown as being formed only in the memory cell region MCR in FIG. 13B, the inventive concept is not limited thereto, and the plurality of vertical channel structures CH may also be formed in the peripheral region SRR.

A vertical hole penetrating through the gate stack 101 may be formed by etching (for example, dry-etching) the gate stack 101. The vertical channel structure CH may be formed in the vertical hole, and may be formed of a channel layer 131 and a buried insulating film 132. The channel layer 131 may vertically extend along an inner wall of the vertical hole without completely filling the vertical hole. The buried insulating film 132 may be formed on the channel layer 131 and completely fill the vertical hole. The channel layer 131 may be formed by a chemical vapor deposition (CVD) process, a low pressure chemical vapor deposition (LPCVD) process, or an atomic layer deposition (ALD) process using impurity-doped polysilicon. In an exemplary embodiment, the channel layer 131 may be formed using polysilicon which is not doped with an impurity. The buried insulating film 132 may be formed by a CVD process, an LPCVD process, or an ALD process using an insulating material such as silicon oxide, silicon nitride, silicon oxynitride, or the like. Next, a drain region 133 may be formed on an upper side of the vertical channel structure CH. The drain region may include impurity-doped polysilicon.

Referring to FIG. 13C, a first gate structure GS1 and a second gate structure GS2 may be formed by patterning the gate stack 101. The first gate structure GS1 and the second gate structure GS2 may be formed through a plurality of patterning processes using masks (not shown). Edge regions of the first gate structure GS1 and the second gate structure GS2 may have step shapes. The first gate structure GS1 may be formed in the memory cell region MCR, and the second gate structure GS2 may be formed in the peripheral region SRR which is outside the memory cell region MCR.

Next, through additional fabrication processes, contacts may be formed in the edge regions of the first gate structure GS1 and the second gate structure GS2, and bit lines and wiring lines may be formed on an upper side of the first gate structure GS1 and the second gate structure GS2. Before forming the gate stack 101 of FIG. 13A, a peripheral circuit may be formed on the first semiconductor layer 10 or on a substrate (not shown) arranged at a lower side of the first semiconductor layer 10.

FIGS. 14A to 14D are sectional views according to a method of fabricating a memory device according to an exemplary embodiment of the present inventive concept.

Figure 14A:
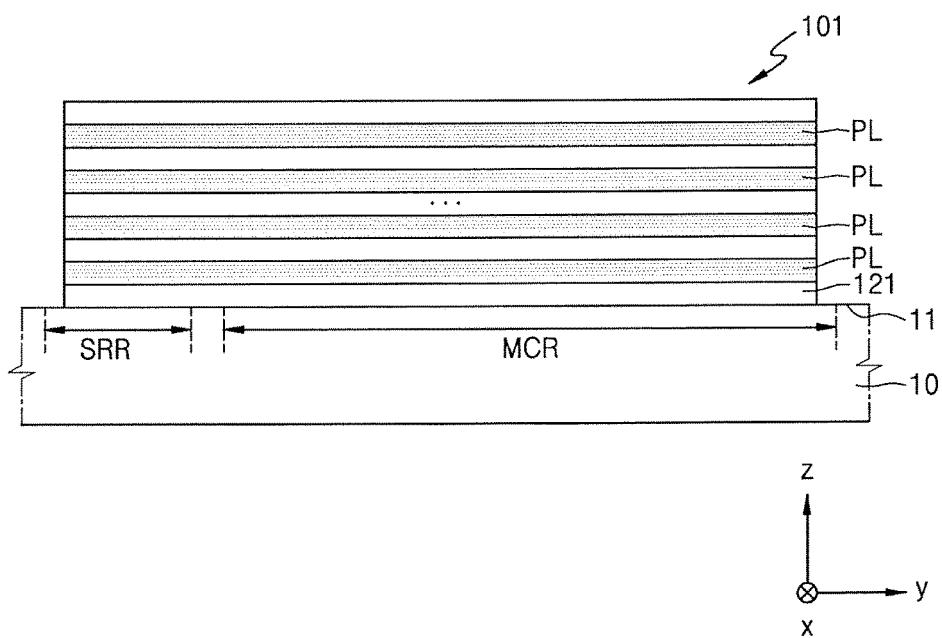
FIGS. 14A to 14D are sectional views according to a process order for explaining a method of fabricating a memory device according to exemplary embodiments of the present inventive concept.

Referring to FIG. 14A, a memory cell region MCR and a peripheral region SRR may be formed on a first semiconductor layer 10, and a gate stack 101 may be formed by alternately stacking a gate electrode insulating layer 121 and a preliminary gate conductive layer PL on the memory cell region MCR and the peripheral region SRR. For example, the gate electrode insulating layer 121 may be formed to a predetermined height using silicon oxide, silicon nitride, or silicon oxynitride. In addition, the preliminary gate conductive layer PL may be formed to a predetermined height using silicon nitride, silicon carbide, or polysilicon. Each of the preliminary gate conductive layers PL may be a preliminary film or sacrificial layer for forming a gate electrode in a subsequent process. The number of the preliminary gate conductive layers PL may be appropriately selected according to the numbers of word lines and select lines.

Figure 14B:
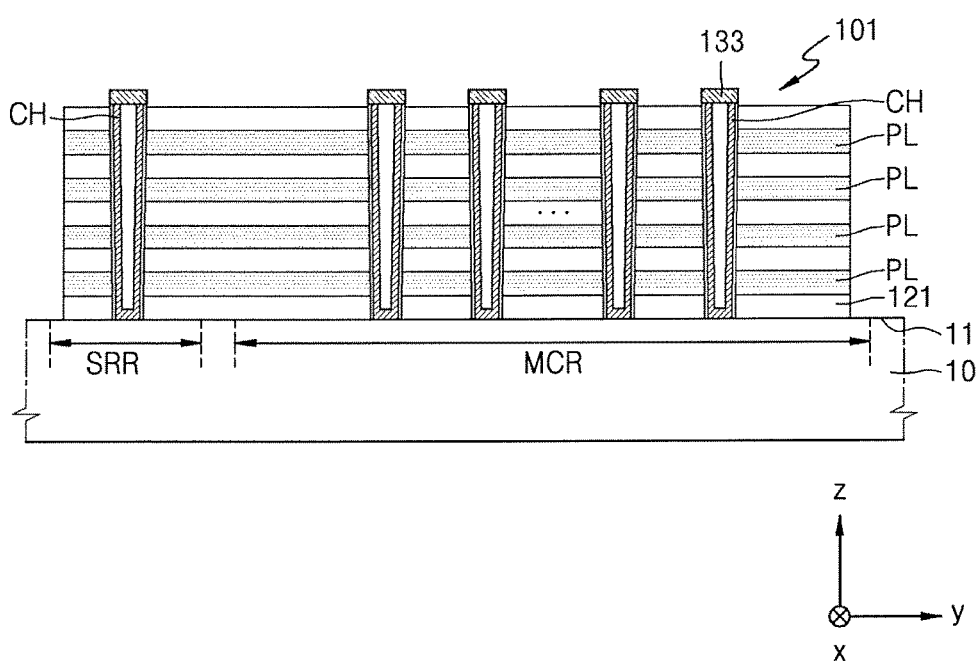

Referring to FIG. 14B, a vertical channel structure CH penetrating through the gate stack 101 may be formed. A plurality of vertical channel structures CH, which is spaced apart from each other in a first direction (the x direction) and in a second direction (the y direction), may be formed. The vertical channel structures may be formed in the memory cell region MCR and the peripheral region SRR. A drain region 133 may be formed on an upper side of the vertical channel structure CH. The drain region may include impurity-doped polysilicon.

Since the vertical channel structure CH has been described above with reference to FIG. 13B, details of the vertical channel structure CH are omitted.

Figure 14C:
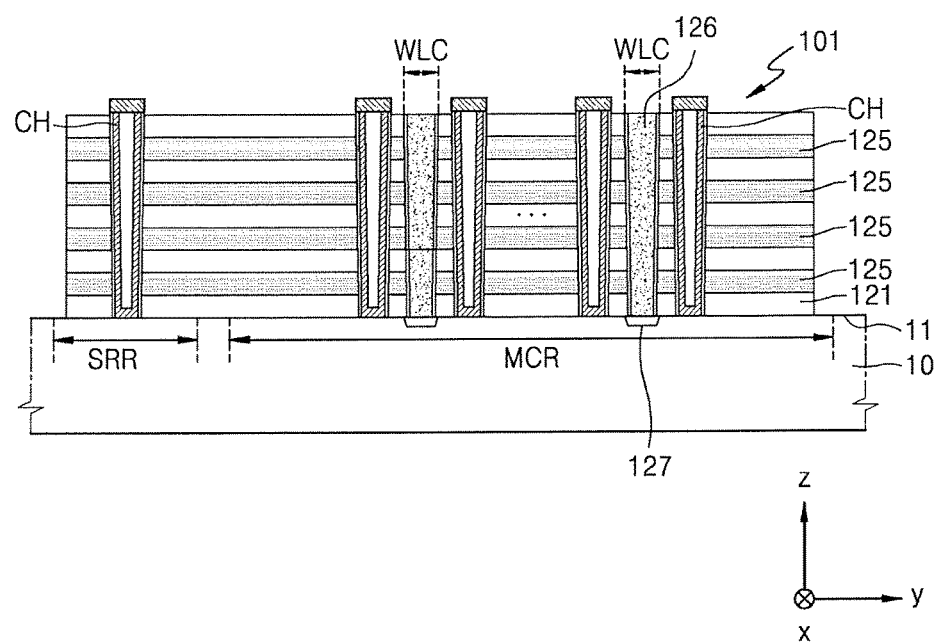

Referring to FIG. 14C, a word line cut WLC penetrating through the gate stack 101 may be formed. Through the word line cut WLC, the preliminary gate conductive layer PL may be substituted with a gate conductive layer 125.

In an exemplary embodiment, the preliminary gate conductive layer PL may include polysilicon, and be subjected to a silicidation process to form the preliminary gate conductive layer PL which may be substituted with the gate conductive layer 125. In this case, the gate conductive layer 125 may include tungsten silicide, tantalum silicide, cobalt silicide, or nickel silicide.

In an exemplary embodiment, the preliminary gate conductive layer PL, which is exposed by the word line cut WLC, may be selectively removed to form a space between two adjacent gate electrode insulating layers 121. A conductive material may be formed in the space, completely filling the space to form the gate conductive layer 125. In this case, the gate conductive layer 125 may be formed using a metal material such as tungsten, tantalum, cobalt, nickel, or the like.

Next, an impurity ion may be implanted into the first semiconductor layer 10 through the word line cut WLC, thereby forming a common source region 127. In addition, a common source line 126 may be formed inside the word line cut WLC. The common source line 126 may include a conductive material. For example, the common source line 126 may include at least one metal material including tungsten (W), aluminum (Al), or copper (Cu). In an exemplary embodiment, a metal silicide layer (not shown) for reducing a contact resistance may be interposed between the common source region 127 and the common source line 126. For example, the metal silicide layer may include cobalt silicide.

Figure 14D:
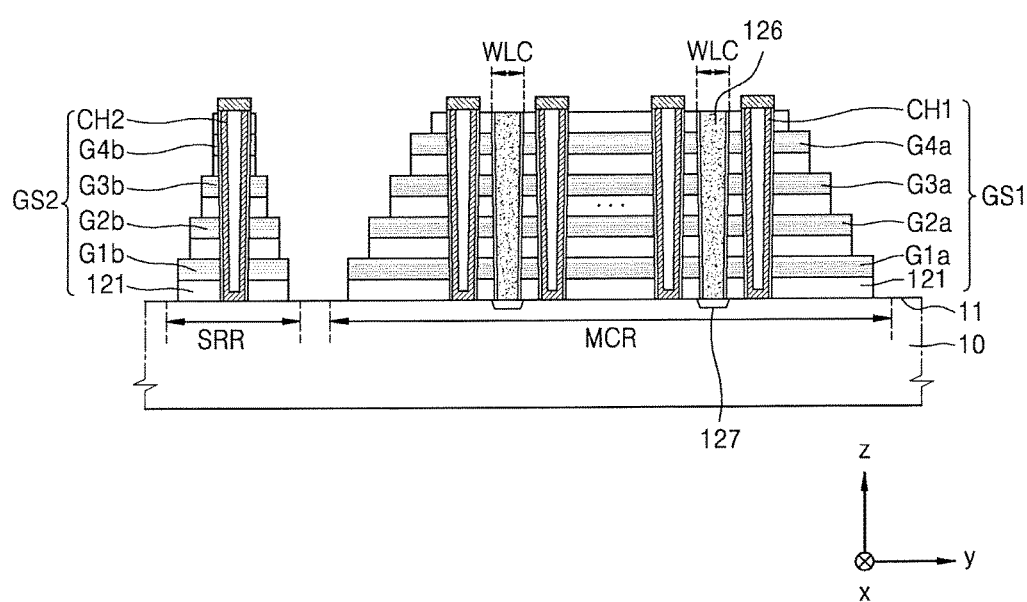

Referring to FIG. 14D, the gate stack 101 may be patterned to form a first gate structure GS1 and a second gate structure GS2. The first gate structure GS1 and the second gate structure GS2 may be formed through a plurality of patterning processes using masks (not shown). Edge regions of the first gate structure GS1 and the second gate structure GS2 may have step shapes. The first gate structure GS1 may be formed in the memory cell region MCR, and the second gate structure GS2 may be formed outside the memory cell region MCR, that is, in the peripheral region SRR.

Next, through additional fabrication processes, contacts may be formed in the edge regions of the first gate structure GS1 and the second gate structure GS2, and bit lines and wiring lines may be formed on an upper side of the first gate structure GS1 and the second gate structure GS2. Before forming the gate stack 101 of FIG. 14A, a peripheral circuit may be formed on the first semiconductor layer 10 or on a substrate (not shown) arranged at a lower side of the first semiconductor layer 10.

As described above with reference to FIGS. 13A to 14D, the second gate structure GS2 may be simultaneously formed according to the same fabrication processes as those of the first gate structure GS1. In an exemplary embodiment, a portion of the first semiconductor layer 10 under the second gate structure GS2 may be removed and the first semiconductor layer 10 may not be arranged under the second gate structure GS2.

With reference to FIGS. 13A to 13C and 14A to 14D, fabrication processes of the memory device, specifically processes of forming the first gate structure GS1 and the second gate structure GS2 have been described. However, these are merely exemplary embodiments, and the inventive concept is not limited thereto. In forming the first gate structure GS1 and the second gate structure GS2, various fabrication methods may be used.

Figure 15:
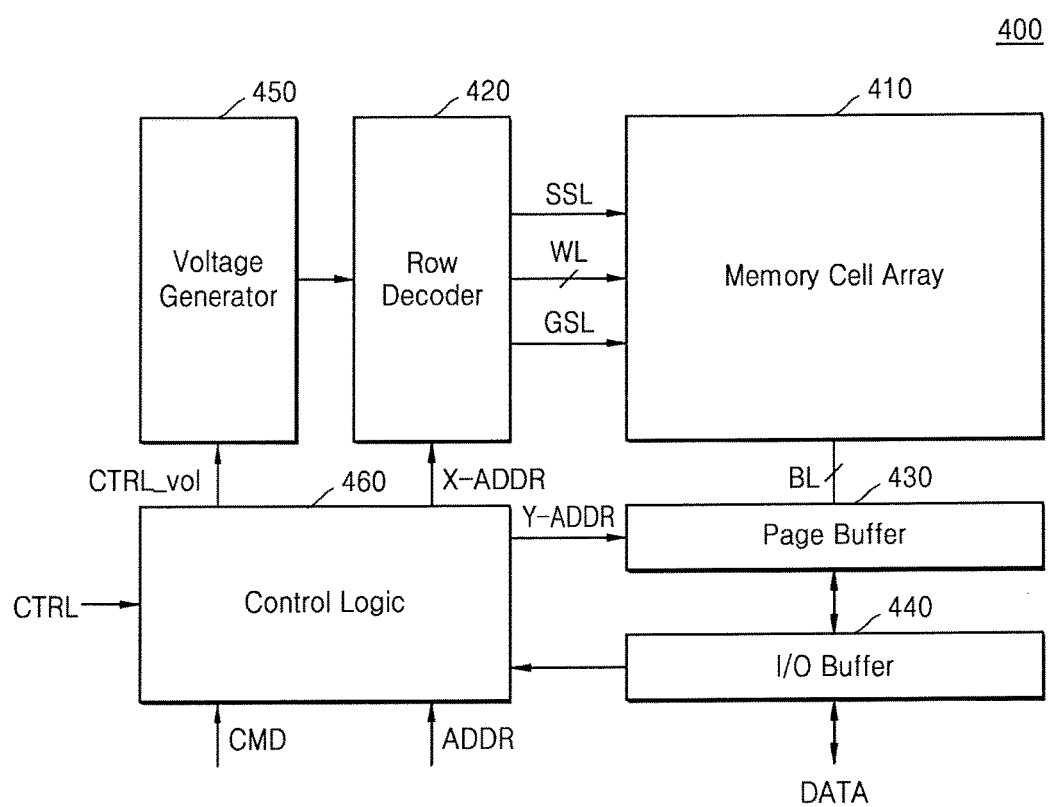
FIG. 15 is a block diagram showing a memory device according to an exemplary embodiment of the present inventive concept.

FIG. 15 is a block diagram showing a memory device according to an exemplary embodiment of the present inventive concept.

A memory device 400 may be a non-volatile memory device including a vertically stacked NAND memory cell array 410.

Referring to FIG. 15, the memory device 400 may include the memory cell array 410, a row decoder 420, a page buffer 430, an input/output buffer 440, a control logic 460, and a voltage generator 450.

The memory cell array 410 may include a plurality of memory cells, and may be connected to word lines WL, string select lines SSL, ground select lines GSL, and bit lines BL. For example, the memory cell array 410 may be connected to the row decoder 420 through the word lines WL or the select lines SSL, GSL, and be connected to the page buffer 430 through the bit lines BL.

The memory cell array 410 may include at least one of a single level cell block including single level cells, a multi-level cell block including multi-level cells, and a triple-level cell block including triple-level cells. Some blocks of a plurality of blocks included in the memory cell array 410 may be single level cell blocks, and other blocks may be multi-level cell blocks or triple-level cell blocks.

The memory cell array 410 may include a plurality of NAND cell strings. The plurality of NAND cell strings may constitute a plurality of memory blocks according to operation or selection units. Each of the plurality of cell strings may be formed in a perpendicular direction to a substrate on which the memory cell array 410 is formed.

In the memory cell array 410, a plurality of word lines may be stacked in a vertical direction, and a channel of each of the cell strings may be formed in a vertical direction. The plurality of word lines, that is, gate electrodes may be stacked and thereby form a gate structure, and edge regions of the gate structure may be formed in a step shape. A contact is formed in at least one of the edge regions of the gate structure, and the memory cell array 410 may receive a word line selection signal from the row decoder 420 through the contact.

Another gate structure, which is separate from the gate structure constituting the memory cell array 410, may be formed in a peripheral region of the memory cell array 410. The other gate structure may include the second gate structure described above with reference to FIGS. 1A to 14. When the memory device 400 is realized in a COP circuit structure, the gate structure formed in the peripheral region of the memory cell array 410 may be formed on an upper side of a peripheral circuit including the row decoder 420, the page buffer 430, the input/output buffer 440, the control logic 460, the voltage generator 450, or the like. The gate structure may be a circuit element. In an exemplary embodiment, the gate structure may be a passive element such as a capacitor, a resistor, and the like. In an exemplary embodiment, the gate structure may be an active element such as a transistor, and the like. In an exemplary embodiment, the gate structure may be a test cell array.

The row decoder 420 may select some word lines from among the word lines WL in response to a row address X-ADDR. The row decoder 420 transfers a word line voltage to the word lines. Upon program operation, the row decoder 420 may apply a program voltage and a verify voltage to selected word lines, and apply a program inhibit voltage to unselected word lines. Upon read operation, the row decoder 420 may apply a read voltage to the selected word lines, and apply a read inhibit voltage to the unselected word lines. In addition, in response to the row address X-ADDR, the row decoder 420 may select some string select lines from among the string select lines SSL, or select some ground select lines from among the ground select lines GSD.

The page buffer 430 may be operated as a write driver or sense amplifier according to operation modes. Upon program operation, the page buffer 430 is operated as a write driver, and may transfer a bit line voltage, which corresponds to data to be programmed, to the bit lines BL of the memory cell array 410.

Upon read operation, the page buffer 430 is operated as a sense amplifier, and thus senses data stored in a selected memory cell through a bit line. The page buffer 430 may latch the sensed data and transfer the sensed data to the outside of the memory device 400. Upon erase operation, the page buffer 430 may float a bit line.

Upon program operation, the input/output buffer 440 may transfer data, which is received from the outside of the memory device 400, to the page buffer 430. Upon read operation, the input/output buffer 440 may output data, which is provided from the page buffer 430, to the outside of the memory device 400. The input/output buffer 440 may transfer an address ADDR or command CMD, which is input thereto, to the control logic 460 or the row decoder 420.

The voltage generator 450 may generate various voltages for performing program, read, and erase operations on the memory cell array 410 based on a voltage control signal CTRL_vol provided from the control logic 460. For example, the voltage generator 450 may generate a word line driving voltage for driving the word lines WL, for example, a program voltage (or a write voltage), a read voltage, a program inhibit voltage, a read inhibit voltage, an erase verify voltage, or a program verify voltage. In addition, the voltage generator 450 may further generate a string select line driving voltage for driving the string select lines SSL or a ground select line driving voltage for driving the ground select lines GSL. Further, the voltage generator 450 may further generate an erase voltage provided to the memory cell array 410.

The control logic 460 may output various control signals for writing data to the memory cell array 410 or reading data from the memory cell array 410 based on a command CMD, an address ADDR, and a control signal CTRL, which are transferred from the outside of the memory device 400. Thus, the control logic 460 may control various operations in the memory device 400 on the whole.

Various control signals output from the control logic 460 may be provided to the voltage generator 450, the row decoder 420, and the page buffer 330. Specifically, the control logic 460 may provide a voltage control signal CTRL_vol to the voltage generator 450, provide a row address X-ADDR to the row decoder 420, and provide a column address Y-ADDR to the page buffer 430. The control logic 460 may further provide other control signals to the voltage generator 450, the row decoder 420, and the page buffer 430.

Figure 16:
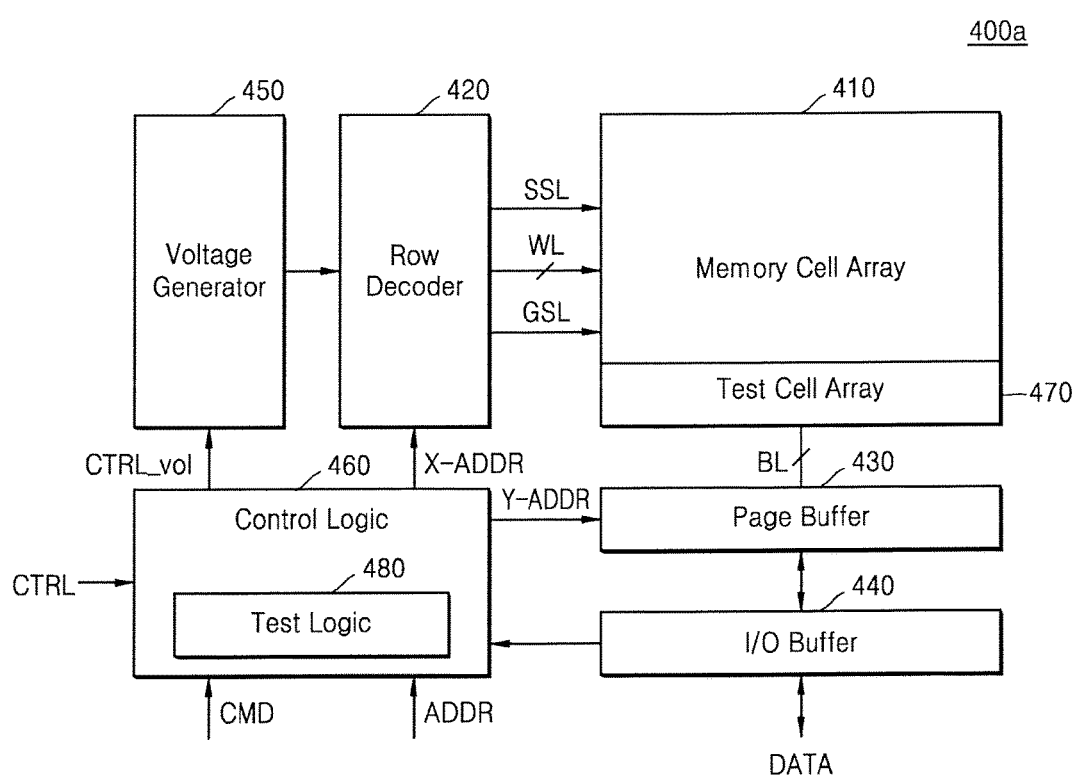
FIG. 16 is a block diagram showing a memory device according to an exemplary embodiment of the present inventive concept.

FIG. 16 is a block diagram showing a memory device according to an exemplary embodiment of the present inventive concept.

Referring to FIG. 16, a memory device 400a may include a memory cell array 410, a test cell array 470, a row decoder 420, a page buffer 430, an input/output buffer 440, a control logic 460, and a voltage generator 450. Operations of the memory device 400a according to the present exemplary embodiment may be realized substantially similarly to the operations of the memory device 400 of FIG. 15, and details described above with reference to FIG. 15 may also be applied to the present exemplary embodiment. Thus, repeated descriptions will be omitted.

As shown in FIG. 16, the memory device 400a may include the memory cell array 410 and the test cell array 470. The memory cell array 410 and the test cell array 470 may be separately operated. The test cell array 470 may be formed at the periphery of the memory cell array 410, and may be formed by a separate gate structure from a gate structure constituting the memory cell array 410. The test cell array 470 may include the second gate structure described above with reference to FIGS. 1A to 14.

The test logic 480 may perform test operations for the test cell array 470. The test logic 480 may generate various test signals provided to the voltage generator 450, the row decoder 420, and the page buffer 430 such that the test operations for the test cell array 470 may be performed. In addition, the test logic 480 may determine test results based on test data received from the test cell array 470.

In an exemplary embodiment, the test logic 480 may perform a test operation for examining electrical properties of the test cell array 470 itself. For example, the test logic 480 may test whether a short current flows through the test cell array 470, whether a write, read, or erase operation for the test cell array 470 is normally performed, or the like.

In an exemplary embodiment, the test logic 480 may perform a test operation for examining electrical properties of the memory cell array 410 on the test cell array 470. For example, when a structure of the test cell array 470 is the same as a structure of the memory cell array 410, the test logic 480 may measure a resistance component, a capacitance component, or the like of gate electrodes of the memory cell array 410 using the test cell array 470. In an exemplary embodiment, the test logic 480 may provide test results to the control logic 460. The control logic 460 may control operations of the memory device 400a based on the test results. For example, the control logic 460 may adjust a level of a voltage provided to the word lines WL or the like in consideration of the test results (for example, resistances of the gate electrodes).

In an exemplary embodiment, the test logic 480 may be realized as a portion of the control logic 460. However, the inventive concept is not limited thereto, and the test logic 480 may be realized as a functional block which is separate from the control logic 460.

Figure 17:
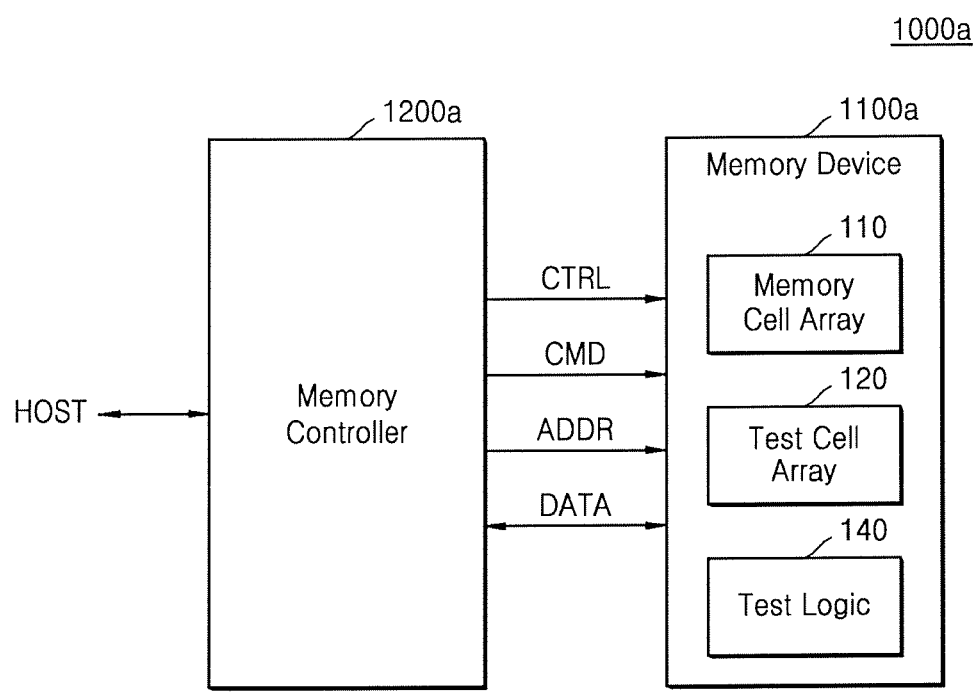
FIG. 17 is a block diagram showing a memory system according to an exemplary embodiment of the present inventive concept.

FIG. 17 is a block diagram showing a memory system according to an exemplary embodiment of the present inventive concept.

A memory system 1000a may be mounted in a host such as computers, laptops, cellular phones, smart phones, MP3 players, personal digital assistants (PDAs), portable multimedia players (PMPs), digital TVs, digital cameras, portable game consoles, and the like.

Referring to FIG. 17, the memory system 1000a may include a memory device 100a and a memory controller 1200a.

The memory controller 1200a may control the memory device 1100a such that data stored in the memory device 1100a is read or data is written to the memory device 1100a in response to a read/write request from a host HOST. For example, the memory controller 1200a may provide an address ADDR, a command CMD, and a control signal CTRL to the memory device 100a to control program (or write), read, and erase operations for the memory device 1100a. In addition, data DATA for program operations and read data DATA may be transmitted and received between the memory controller 1200a and the memory device 1100a.

The memory controller 1200a may include a RAM, a processing unit, a host interface, and a memory interface, although these components are not shown in FIG. 17. The RAM may be used as an operation memory of the processing unit, and the processing unit may control operations of the memory controller 1200a. The host interface may include a protocol for performing data exchange between the host and the memory controller 1200a. For example, the memory controller 1200a may be configured to communicate with the outside (HOST) of the memory system 1000a through at least one of various interface protocols such as USB, MMC, PCI-E, advanced technology attachment (ATA), serial-ATA, parallel-ATA, SCSI, ESDI, integrated drive electronics (IDE), and the like.

A memory cell array 110 may include a plurality of memory cells. For example, the plurality of memory cells may be flash memory cells. However, the present inventive concept is not limited thereto. For example, the plurality of memory cells may be resistive memory cells such as resistive RAMs (RRAMs), phase change RAMs (PRAMs), or magnetic RAMs (MRAMs). The memory cell array 110 may be a 3-dimensional memory cell array including a vertical NAND string in which one memory cell is vertically arranged on another memory cell.

The memory device 1100a may include the memory cell array 110, a test cell array 120, and a test logic 140. The memory device 1100a may be realized as the memory device 400a shown in FIG. 16. Thus, details of the memory device 400a described above may be applied to the present exemplary embodiment.

The test cell array 120 may be formed in a peripheral region of the memory cell array 110. The test cell array 120 may be formed at the same level as the memory cell array 110 on a substrate or a semiconductor layer. In an exemplary embodiment, the test cell array 120 may have the same structure as the memory cell array 110. For example, the number of gate electrodes included in the test cell array 120 may be the same as the number of gate electrodes included in the memory cell array 110. In addition, an arrangement shape of vertical channel structures included in the test cell array 120 may be the same as an arrangement shape of vertical channel structures included in the memory cell array 110. However, the inventive concept is not limited thereto. For example, the test cell array 120 may have a different structure from the memory cell array 110.

The test logic 140 may perform test operations for the test cell array 120. In an exemplary embodiment, the test logic 140 may perform a test operation for examining electrical properties of the test cell array 120 itself. In an exemplary embodiment, the test logic 140 may perform a test operation for examining electrical properties of the test cell array 120 using the test cell array 120.

In an exemplary embodiment of the present inventive concept, the test logic 140 may be formed below the memory cell array 110 and the test cell array 120. For example, as described with reference to FIG. 6, the memory cell array 110 and the test cell array 120 may be formed in a second level on a substrate, and the test logic 140 may be formed in a first level on the substrate.

In an exemplary embodiment, operations of the memory device 1100a may be internally controlled based on test results provided from the test logic 140.

In an exemplary embodiment, the memory device 1100a may provide test results generated using the test cell array 120 to the memory controller 1200a. For example, the test results may be provided to the memory controller through at least one of signal paths for the data DATA, the address ADDR, the command CMD. In an exemplary embodiment, the test results may be provided to the memory controller through a dedicated signal path for the test results. The memory controller 1200a may generate a signal for controlling operations of the memory cell array 110 based on the test results, and may provide the signal as a control signal CTRL to the memory device 1100a. The memory device 1100a may control program (or write), read, and erase operations for the test cell array 110 based on the control signal CTRL.

Figure 18:
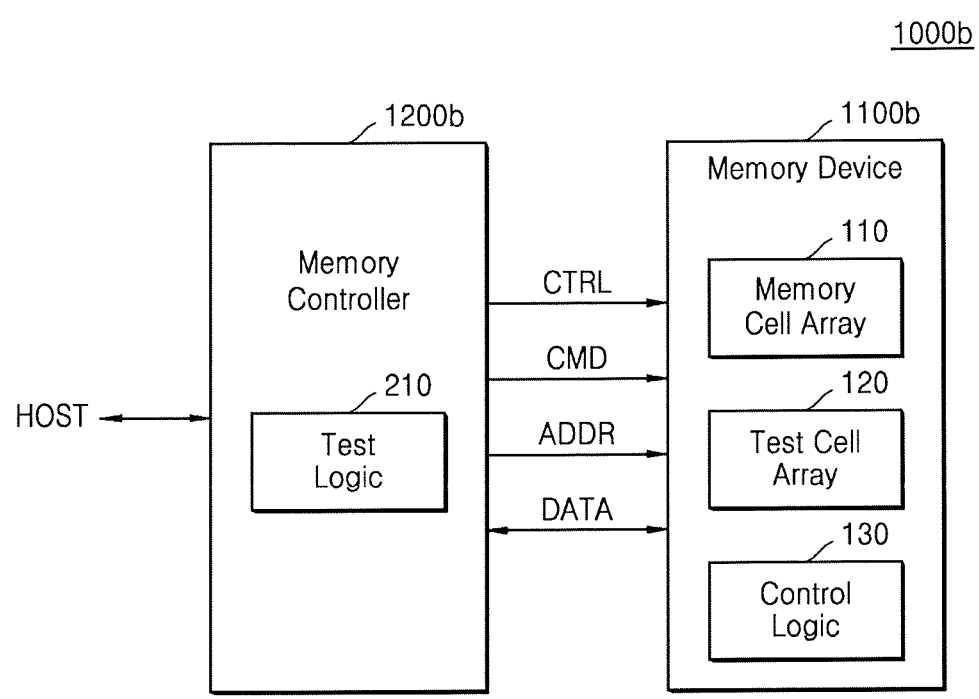
FIG. 18 is a block diagram showing a memory system according to an exemplary embodiment of the present inventive concept.

FIG. 18 is a block diagram showing a memory system according to an exemplary embodiment of the present inventive concept.

Referring to FIG. 18, a memory system 1000b may include a memory device 1100b and a memory controller 1200b. The memory controller 1200b may include a test logic 210, and the memory device 1100b may include a memory cell array 110, a test cell array 120, and a control logic 130.

The memory controller 1200b may provide an address ADDR, a command CMD, and a control signal CTRL to the memory device 1100b, and thereby control program (or write), read, and erase operations for the memory device 1100b. Data may be transmitted and received between the memory controller 1200b and the memory device 1100b.

The memory device 1100b according to the present exemplary embodiment may be realized substantially similarly to the memory device 1100a of FIG. 17. Thus, repeated descriptions will be omitted. In the present exemplary embodiment, the memory controller 1200b may include the test logic 210. The test logic 210 may control test operations for the memory device 1100b on the whole. The test logic 210 may include a test algorithm for the memory device 1100b. For example, the test logic 210 may generate a control signal CTRL for controlling test operations for the memory cell array 110 and the test cell array 120, and provide the control signal CTRL to the memory device 1100b. The control logic 130 may test the memory cell array 110 and the test cell array 120 in response to the control signal CTRL. The memory device 1100b may provide test results to the memory controller 1200b, and the memory controller 1200b may generate a signal for controlling operations of the memory cell array 110 based on the test results.

In an exemplary embodiment, the test logic 210 may receive data obtained from the memory cell array 110 or the test cell array 120, and determine test results by analyzing the data. The memory controller 1200b may generate a signal for controlling operations of the memory cell array 110 based on the determined test results, and provide the signal as a control signal CTRL to the memory device 1100b. The memory device 1100b may control program (or write), read, and erase operations for the memory cell array 110 based on the control signal CTRL.

In an exemplary embodiment of the present inventive concept, the control logic 130 may be formed below the memory cell array 110 and the test cell array 120. For example, as described with reference to FIG. 6, the memory cell array 110 and the test cell array 120 may be formed in a second level on a substrate, and the control logic 130 may be formed in a first level on the substrate.

Figure 19:
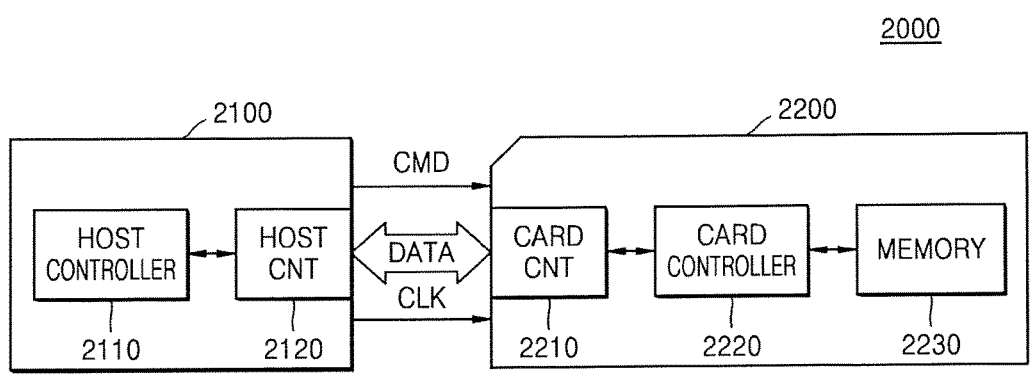
FIG. 19 is a block diagram showing a memory card system according to an exemplary embodiment of the present inventive concept.

FIG. 19 is a block diagram showing a memory card system according to an exemplary embodiment of the present inventive concept.

Referring to FIG. 19, a memory card system 2000 may include a host 2100 and a memory card 2200. The host 2100 may include a host controller 2110 and a host connecting portion 2120. The memory card 2200 may include a card connecting portion 2210, a card controller 2220, and a memory device 2230.

The host 2100 may write data to the memory card 2200, or may read data stored in the memory card 2200. The host controller 2110 may transmit a command CMD, a clock signal CLK, which is generated from a clock generator (not shown) in the host 2100, and data DATA to the memory card 2200 through the host connection portion 2120.

The card controller 2220 may be synchronized with a clock signal generated from a clock generator (not shown) in the card controller 2220 and store data in the memory device 2230 in response to a command received through the card connecting portion 2210. The memory device 2230 may store data transmitted from the host 2100. The memory device 2230 may be any one of the memory devices 100, 100a, 100b, 100c, 100d, 200, 200a, 200b, 300, 400, 400a described above with reference to FIGS. 1A to 16.

The memory device 2230 may include a second gate structure formed at the periphery of a first gate structure constituting a memory cell array. The second gate structure may constitute a circuit element. When the memory device 2230 is formed in a COP circuit structure, the second gate structure may be formed on an upper side of peripheral circuits, and an additional layout space for forming the second gate structure is not required. Thus, a layout area of the memory device 2230 may be reduced. The second gate structure may be used as a passive or active element. The memory device 2230 may be stably operated according to operations of the circuit element including the second gate structure. Therefore, a size of the memory card 2200 may be reduced, and the memory card 2200 may be stably operated.

The memory card 2200 may be realized as a compact flash card (CFC), a microdrive, a smart media card (SMC), a multimedia card (MMC), a security digital card (SDC), a memory stick, a USB flash memory drive, or the like.

Figure 20:
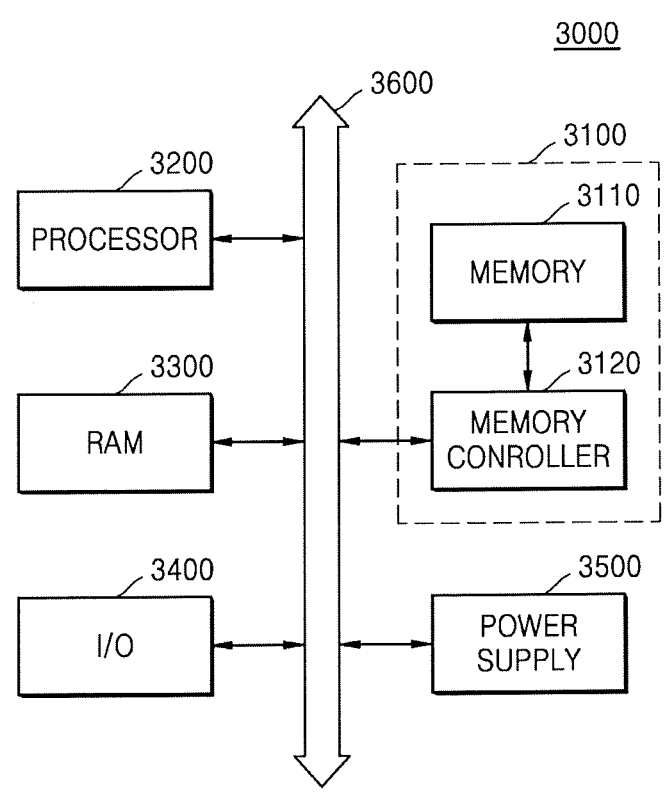
FIG. 20 is a block diagram showing a computing system according to an exemplary embodiment of the present inventive concept.

FIG. 20 is a block diagram showing a computing system according to an exemplary embodiment of the present inventive concept.

Referring to FIG. 20, a computing system 3000 may include a memory system 3100, a processor 3200, a RAM 3300, an input/output device 3400, and a power supply 3500. The computing system 3000 may further include ports for communicating with video cards, sound cards, memory cards, USB devices, or other electronic devices, although the ports are not shown in FIG. 20. The computing system 3000 may be realized as a personal computer, or realized as a portable electronic device such as laptops, cellular phones, personal digital assistants (PDAs), cameras, and the like.

The processor 3200 may perform specific computations or tasks. According to an exemplary embodiment, the processor 3200 may be a microprocessor or a central processing unit (CPU). The processor 3200 may communicate with the RAM 3300, the input/output device 3400, and the memory system 3100 through a bus 3600 such as an address bus, a control bus, a data bus, and the like. According to an exemplary embodiment, the processor 3200 may also be connected to an extension bus such as a peripheral component interconnect (PCI) bus.

The memory system 3100 may communicate with the processor 3200, the RAM 3300, and the input/output device 3400. The memory system 3100 may store received data, or provide stored data to the processor 3200, the RAM 3300, or the input/output device 3400 according to a request of the processor 3200. The memory system 3100 may be the memory system 1000a, 1000b described above with reference to FIGS. 17 and 18. In an exemplary embodiment, the memory system 3100 may include the memory devices 100, 100a, 100b, 100c, 100d, 200, 200a, 200b, 300, 400, 400a described above with reference to FIGS. 1A to 16. The memory system 3100 may have a reduced size simultaneously with being stably operated.

The RAM 3300 may store data needed for operations of the computing system 3000. For example, the RAM 3300 may be realized as a DRAM, a mobile RAM, an SRAM, a PRAM, an FRAM, an RRAM, and/or an MRAM.

The input/output device 3400 may include an input device, such as a keyboard, a keypad, a mouse, and the like, and an output device, such as a printer, a display, and the like. The power supply 3500 may supply operation voltages needed for operations of the computing system 2000.

Figure 21:
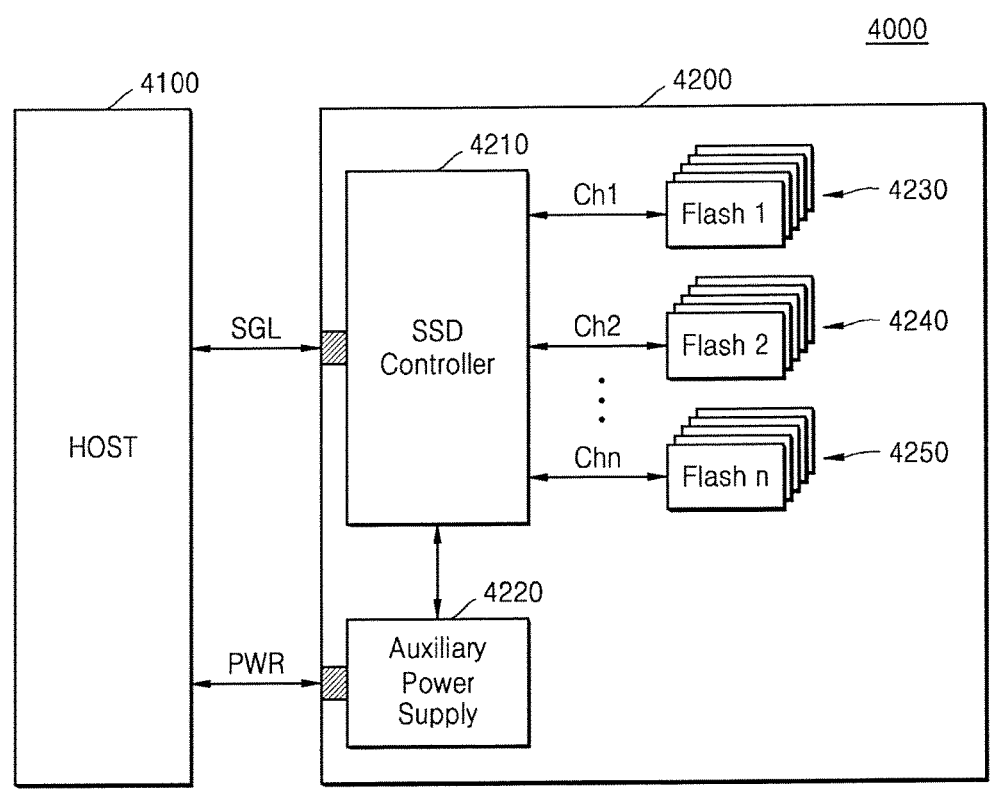
FIG. 21 is a block diagram showing an SSD system according to an exemplary embodiment of the present inventive concept.

FIG. 21 is a block diagram showing an SSD system according to an exemplary embodiment of the present inventive concept.

Referring to FIG. 21, an SSD system 4000 may include a host 4100 and an SSD 4200. The SSD 4200 sends a signal to and receives a signal from the host 4100 through a signal connector, and receives power through a power connector.

The SSD 4200 may include an SSD controller 4210, an auxiliary power supply 4220, and a plurality of memory devices 4230, 4240, 4250. The plurality of memory devices 4230, 4240, 4250 may be vertically stacked NAND flash memory devices. The plurality of memory devices 4230, 4240, 4250 may include an exemplary memory device according to the present inventive concept. For example, the plurality of memory devices 4230, 4240, 4250 may include a second gate structure formed at the periphery of a first gate structure constituting a memory cell array. The plurality of memory devices 4230, 4240, 4250 may be stably operated, and have a reduced size. Thus, the SSD 4200 may also have a reduced size, and exhibit increased performance.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A non-volatile memory device comprising:
a substrate having a peripheral circuit;
a first semiconductor layer disposed on the substrate, the first semiconductor layer comprising a first well region and a second well region which is separated from the first well region;
a first gate structure disposed on the first well region of the first semiconductor layer, the first gate structure comprising a plurality of first gate electrodes stacked in a perpendicular direction to the first semiconductor layer and a plurality of vertical channel structures penetrating the plurality of first gate electrodes; and
a second gate structure disposed on the second well region of the first semiconductor layer, the second gate structure comprising a plurality of second gate electrodes stacked in the perpendicular direction to the first semiconductor layer, the second gate structure being arranged outside the memory cell region,
wherein the first well region and the second well region are disposed on the peripheral circuit, and
wherein the entire first gate structure vertically overlaps the first well region and the entire second gate structure vertically overlaps the second well region.

2. The non-volatile memory device of claim 1, wherein the second gate structure overlaps at least a portion of the peripheral circuit.

3. The non-volatile memory device of claim 1, wherein the peripheral circuit includes a first peripheral circuit and a second peripheral circuit, and wherein the first gate structure overlaps the first peripheral circuit, and the second gate structure overlaps the second peripheral circuit.

4. The non-volatile memory device of claim 3, wherein the first peripheral circuit comprises a row decoder providing a gate voltage to the first gate structure.

5. The non-volatile memory device of claim 3, wherein the first peripheral circuit comprises a data input/output circuit transmitting data from the first gate structure to the outside of the non-volatile memory device.

6. The non-volatile memory device of claim 1, wherein the second gate structure is spaced apart from one side of the first gate structure in a first direction in which the first gate structure extends.

7. The non-volatile memory device of claim 1, wherein the second gate structure is spaced apart from one side of the first gate structure in a second direction in which the first gate structure extends, and wherein a length of the second gate structure in a first direction orthogonal to the second direction is substantially the same as a length of the first gate structure in the first direction.

8. The non-volatile memory device of claim 1, wherein a height of the second gate structure is substantially equal to or less than a height of the first gate structure.

9. The non-volatile memory device of claim 1, wherein the first gate structure constitutes a memory cell array, and the second gate structure constitutes a circuit element used for operations of the memory cell array.

10. The non-volatile memory device of claim 9, wherein the second gate structure is configured to be a capacitor.

11. The non-volatile memory device of claim 9, wherein the second gate structure is configured to be a test cell array for testing electrical properties of the first gate structure.

12. The non-volatile memory device of claim 1, wherein the second gate structure comprises a plurality of pads, and wherein each of the plurality of pads extend from a corresponding gate electrode of the plurality of second gate electrodes to form a step shape.

13. The non-volatile memory device of claim 12, wherein a first power supply voltage is applied to a pad of the plurality of pads, and a second power supply voltage is applied to another pad of the plurality of pads.

14. The non-volatile memory device of claim 12, wherein the second gate structure further comprises vertical channel structures penetrating the plurality of second gate electrodes.

15. The non-volatile memory device of claim 14, wherein an arrangement shape of the vertical channel structures of the second gate structure is different from an arrangement shape of the vertical channel structures of the first gate structure.

16. A non-volatile memory device comprising:
a substrate including a peripheral circuit;
a memory cell array disposed on the substrate and vertically overlapped with a first portion of the peripheral circuit in a perpendicular direction to the substrate, the memory cell array comprising a first gate structure; and
a second gate structure disposed on the substrate, the second gate structure being electrically isolated from the memory cell array and vertically overlapping a second portion of the peripheral circuit in the perpendicular direction to the substrate, and
wherein the first gate structure and the second gate structure are disposed on well regions separated from each other, and
wherein the first and second portions of the peripheral circuit are formed at a first level on the substrate and the well regions are formed at a second level on the substrate, and the first level is closer to the substrate than the second level.

17. The non-volatile memory device of claim 16, wherein the second gate structure is arranged parallel to the first gate structure in a first direction parallel to the substrate.

18. The non-volatile memory device of claim 16, wherein the second gate structure constitutes a circuit element.

19. The non-volatile memory device of claim 18, wherein the circuit element comprises a test cell array.

20. A non-volatile memory system comprising:
the non-volatile memory device of claim 16; and
a memory controller which generates a control signal for controlling operations of the memory cell array based on data obtained from the second gate structure and provides the control signal to the non-volatile memory device.

21. The non-volatile memory device of claim 1, wherein the first gate structure and the second gate structure are electrically connected to the peripheral circuit through a vertical contact penetrating through the first semiconductor layer, an insulating thin film and a wiring layer.

* * * * *